US008415607B2

(12) United States Patent
Duerksen

(10) Patent No.: US 8,415,607 B2
(45) Date of Patent: Apr. 9, 2013

(54) TRANSMISSIVE DETECTORS, SYSTEMS INCORPORATING SAME, AND ASSOCIATED METHODS

(75) Inventor: Gary L. Duerksen, Ward, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/678,241

(22) PCT Filed: Sep. 15, 2008

(86) PCT No.: PCT/US2008/076416
§ 371 (c)(1),
(2), (4) Date: Jun. 3, 2010

(87) PCT Pub. No.: WO2009/036436
PCT Pub. Date: Mar. 19, 2009

(65) Prior Publication Data
US 2010/0276573 A1    Nov. 4, 2010

Related U.S. Application Data

(60) Provisional application No. 60/971,992, filed on Sep. 13, 2007.

(51) Int. Cl.
*G01J 1/42* (2006.01)

(52) U.S. Cl. .................. 250/208.6; 250/208.2; 257/432

(58) Field of Classification Search .................. 257/444, 257/432; 250/208.6
See application file for complete search history.

(56) References Cited

U.S. PATENT DOCUMENTS

| | | | |
|---|---|---|---|
| 5,748,371 A | 5/1998 | Cathey, Jr. et al. | |
| 5,790,255 A * | 8/1998 | Jackson et al. | 356/622 |
| 6,037,644 A | 3/2000 | Daghighian et al. | |
| 6,670,599 B2 | 12/2003 | Wagner et al. | |
| 6,879,014 B2 | 4/2005 | Wagner et al. | |

FOREIGN PATENT DOCUMENTS

| | | |
|---|---|---|
| GB | 2317228 | 3/1998 |
| WO | WO 01/78153 | 10/2001 |
| WO | WO 03/004965 | 1/2003 |

OTHER PUBLICATIONS

Jun et al., "Optimization of Phase-Sensitive Transparent Detector for Length Measurements," IEEE Trans. Electr. Dev., 52, No. 7 (2005), pp. 1656-1661.

Ng, "Fourier slice photography," Proceedings of SIGGRAPH, ACM Transactions on Graphics, Jul. 2005, 10 pages.

Ozaktas H.M., et al., "Fractional Fourier transforms and their optical implementation: II," J. Opt. Soc. Amer. A, vol. 10 (1993), pp. 2522-2531.

(Continued)

*Primary Examiner* — Tony Ko
(74) *Attorney, Agent, or Firm* — Lathrop & Gage LLP

(57) ABSTRACT

A detector assembly is configured for characterizing electromagnetic energy that propagates along a light path. At least a component of the electromagnetic energy carries electromagnetic energy information along the light path. The detector assembly includes a first detector array arranged along the light path and having photosensitive elements aligned to receive at least some of the electromagnetic energy, including the component. The photosensitive elements selectively absorb a first portion of the component and produce a first set of electrical image data, based at least in part on the electomagnetic energy information, in response to the component. At least some of the photosensitive elements are at least partially transparent so that they selectively pass a second portion of the component to continue along the light path.

21 Claims, 31 Drawing Sheets

OTHER PUBLICATIONS

Johnson et al. "Passive ranging through wavefront coding: information and application," Applied Optics, vol. 39, No. 11, pp. 1700-1710.

Burt, P.J. et al., "Enhanced image capture through fusion", International Conference on Computer Vision (1993), pp. 173-182.

Ogden, J.M., et al., "Pyramid-based computer graphics," RCA Engineer, vol. 30 No. 5 (1985), pp. 4-15.

Agarwala et al., "Interactive digital photomontage," ACM SIGGraph 2004 Conference Proceedings (2004), 9 pages.

Auto-Montage by Synoptics Co., accessed on Internet Oct. 23, 2010, http://www.syncroscopy.com/syncroscopy/automontage.asp, 2 pages.

Ng, R. et al. "Light Field Photography with a Hand-held Plenoptic Camera," Stanford Tech Report CTSR 2005-02, pp. 1-11.

PCT/US08/76416 International Search Report & Written Opinion mailed Mar. 23, 2009, 17 pages.

European Patent Application No. 08830102.3, Communication Pursuant to Rules 161(1) and 162 EPC dated May 26, 2010, 2 pages.

European Patent Application No. 08830102.3, Response to Communication Pursuant to Rules 161(1) and 162 EPC dated Jul. 2, 2010, 19 pages.

Haeberli, P., Grafica Obscura website, accessed on the Internet Jan. 12, 2011, http://www.graficaobscura.com/?, 2 pages.

Knipp, D. et al., "Silicon-Based Micro-Fourier Spectrometer" IEEE Transactions on Electron Devices, vol. 52, issue 3, Mar. 2005, pp. 419-426.

Fienup, J.R., "Phase retrieval algorithms: a comparison" Applied Optics, vol. 21, No. 15 (Aug. 1982) pp. 2758-2768.

Namias, V. "The fractional order fourier transform and its application in quantum mechanics," J. Inst. Math. Appl., vol. 25 (1980), pp. 241-265.

Gerchberg, R.W. et al., "A practical algorithm for the determination of the phase from image and diffraction plane pictures," Optik, vol. 35 (1972), pp. 237-246.

Li, Y. et al., "Precision optical displacement sensor based on ultra-thin film photodiode type optical interferometer," Meas. Sci. & Tech., 14 (2003), pp. 479-483.

Communication Pursuant to Article 94(3) EPC issued in related European Patent Application 08830102.3, dated Dec. 9, 2010, 5 pages.

Office Action issued in related Chinese Application 200880113438.3 dated May 21, 2012, 16 pages.

Response to Office Action issued in related Chinese Application 200880113438.3 filed Aug. 1, 2012, 22 pages.

\* cited by examiner

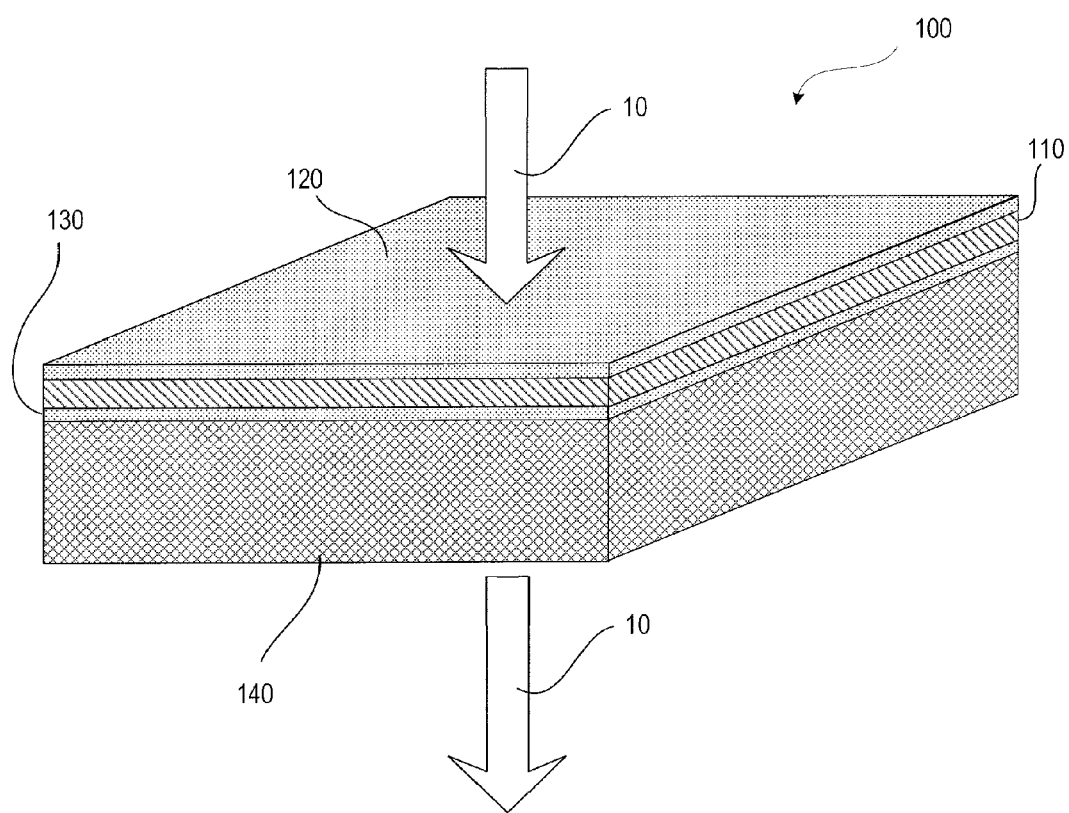
FIG. 1
*PRIOR ART*

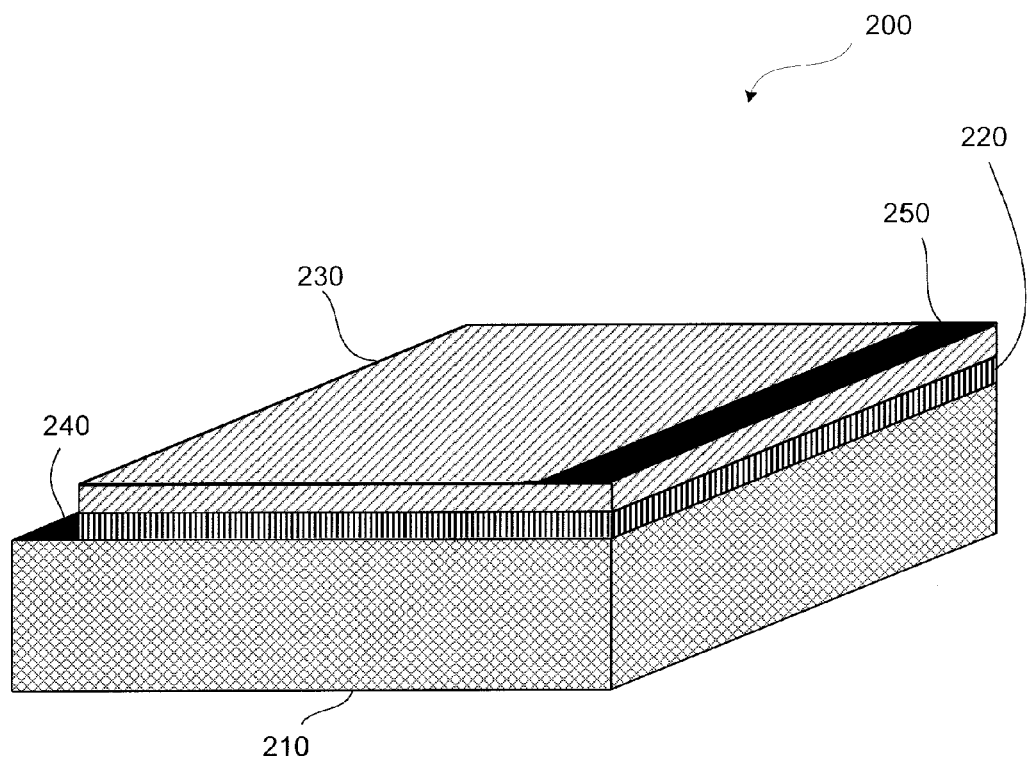
FIG. 2
*PRIOR ART*

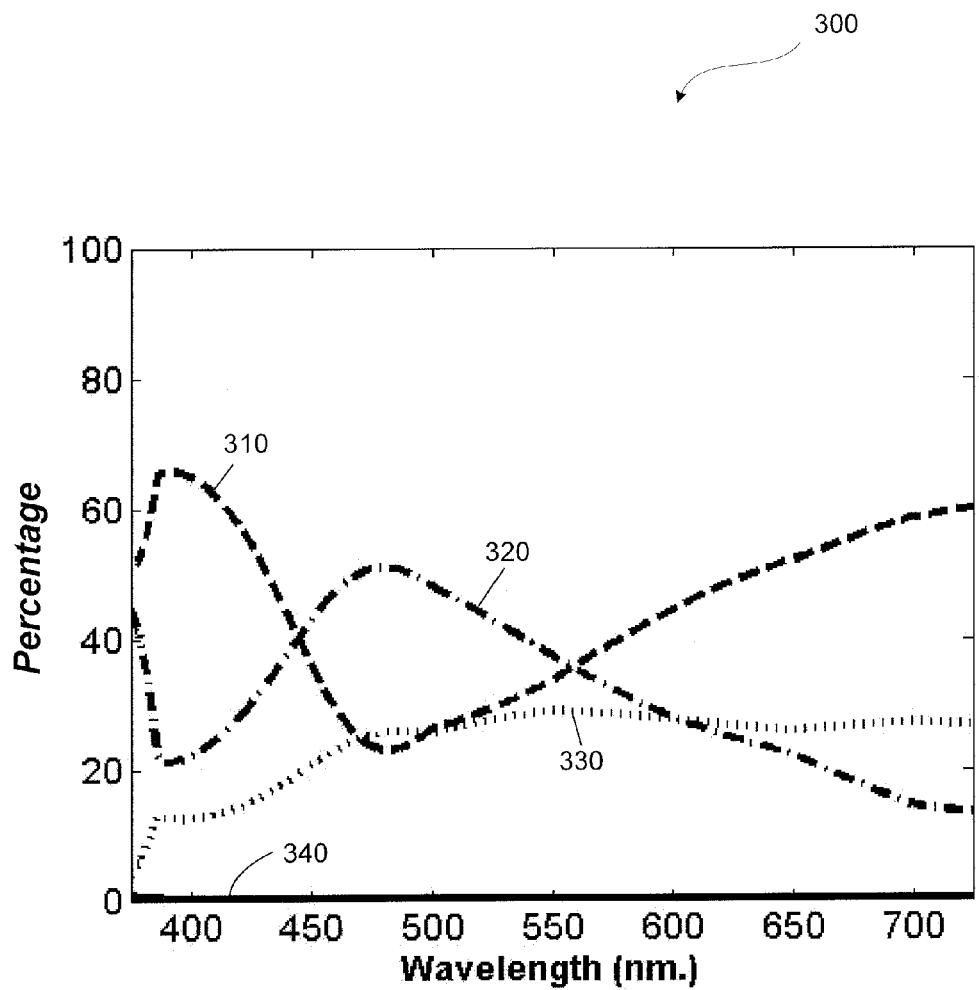
FIG. 3
*PRIOR ART*

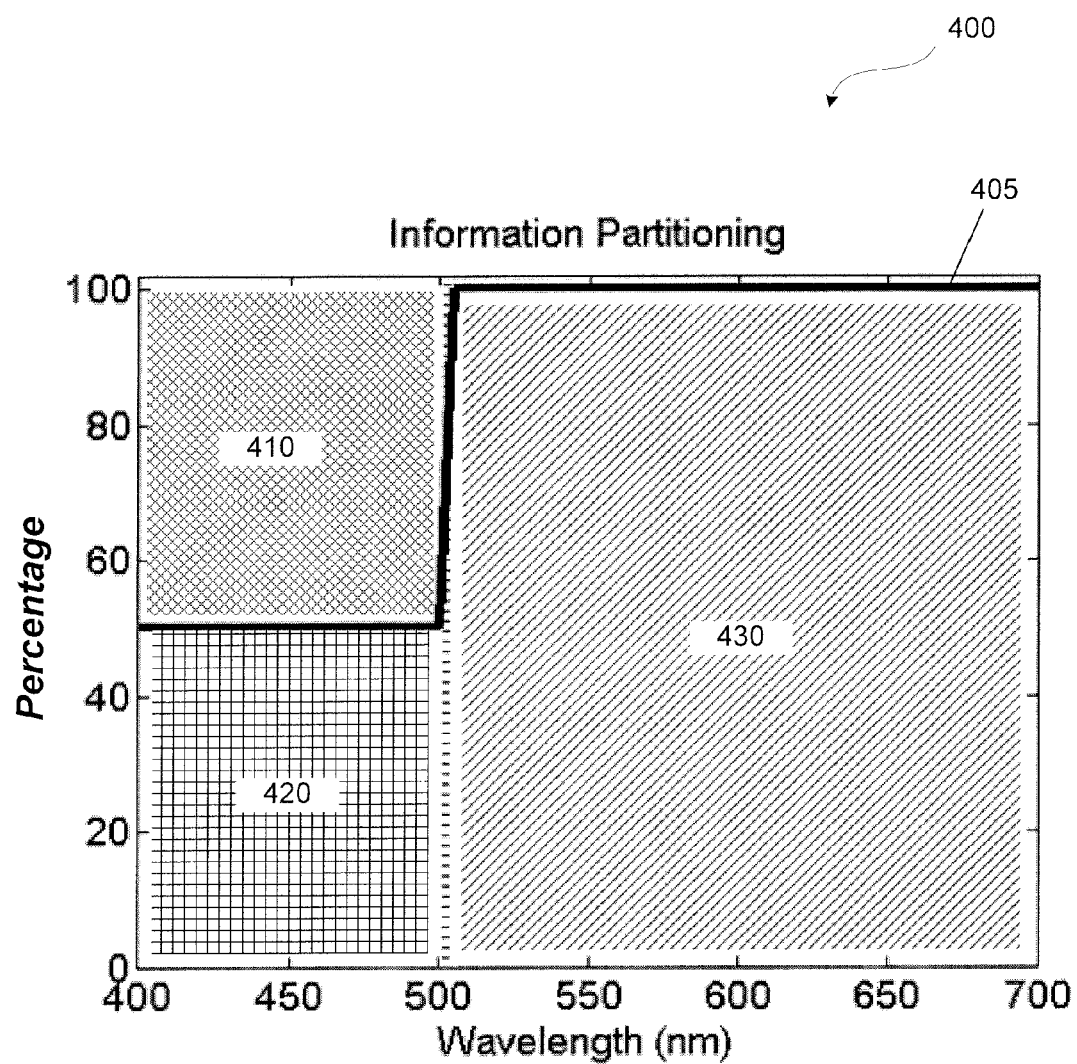
FIG. 4

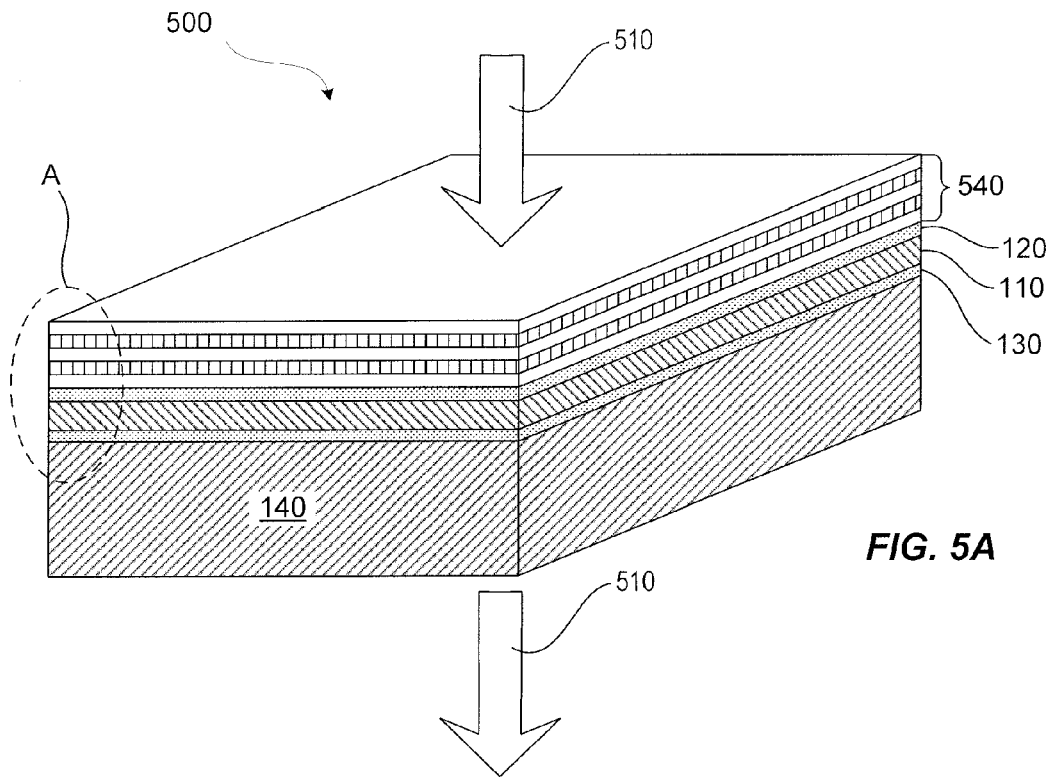
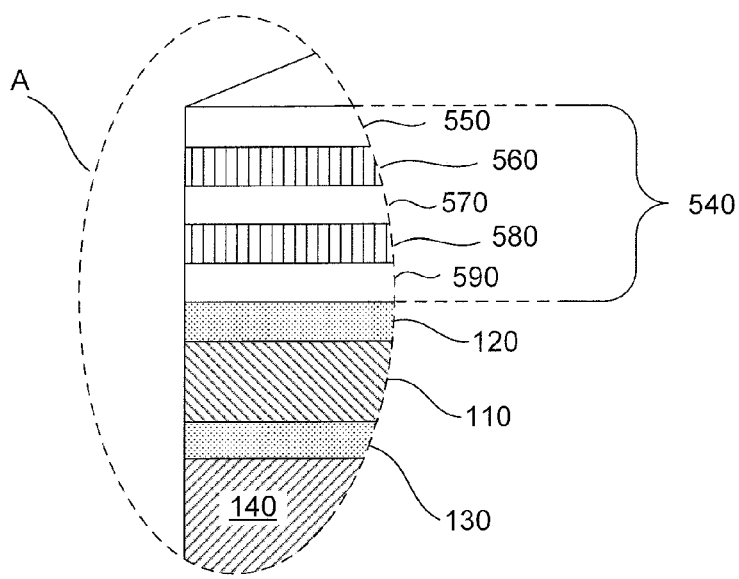
FIG. 5A
FIG. 5B
FIG. 5

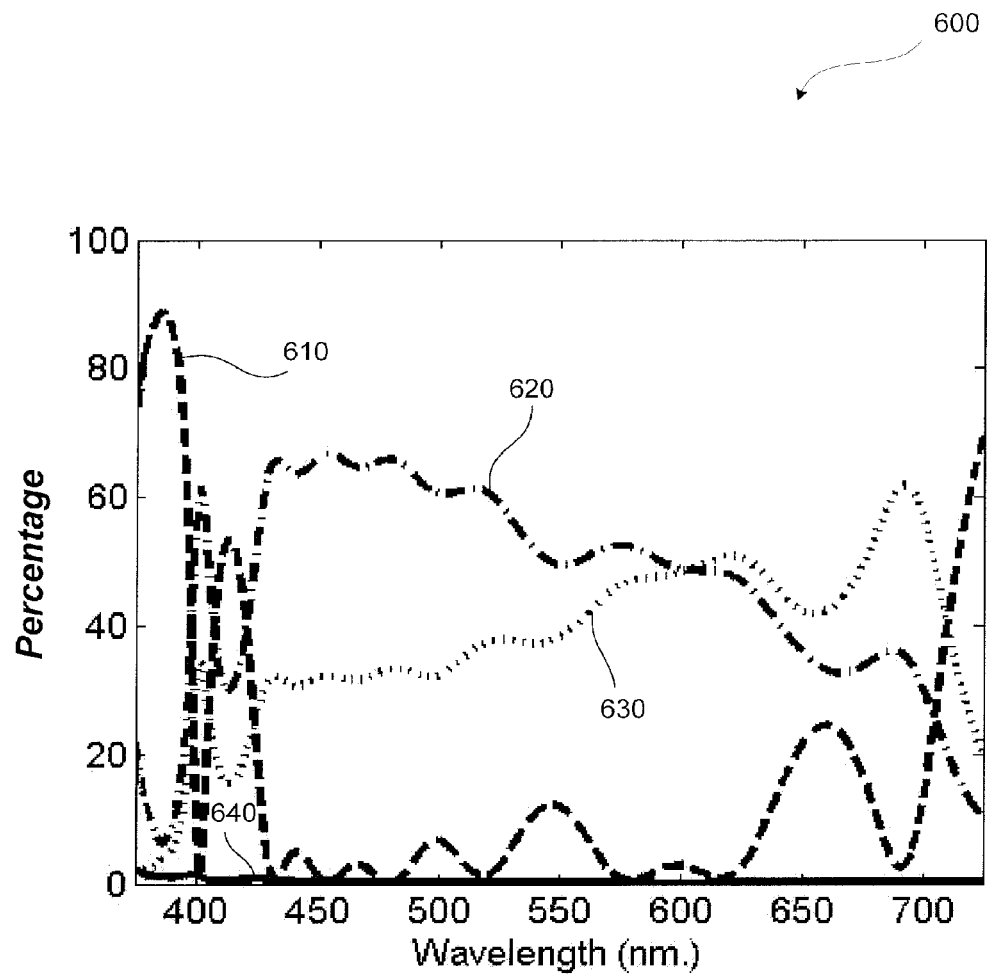
FIG. 6

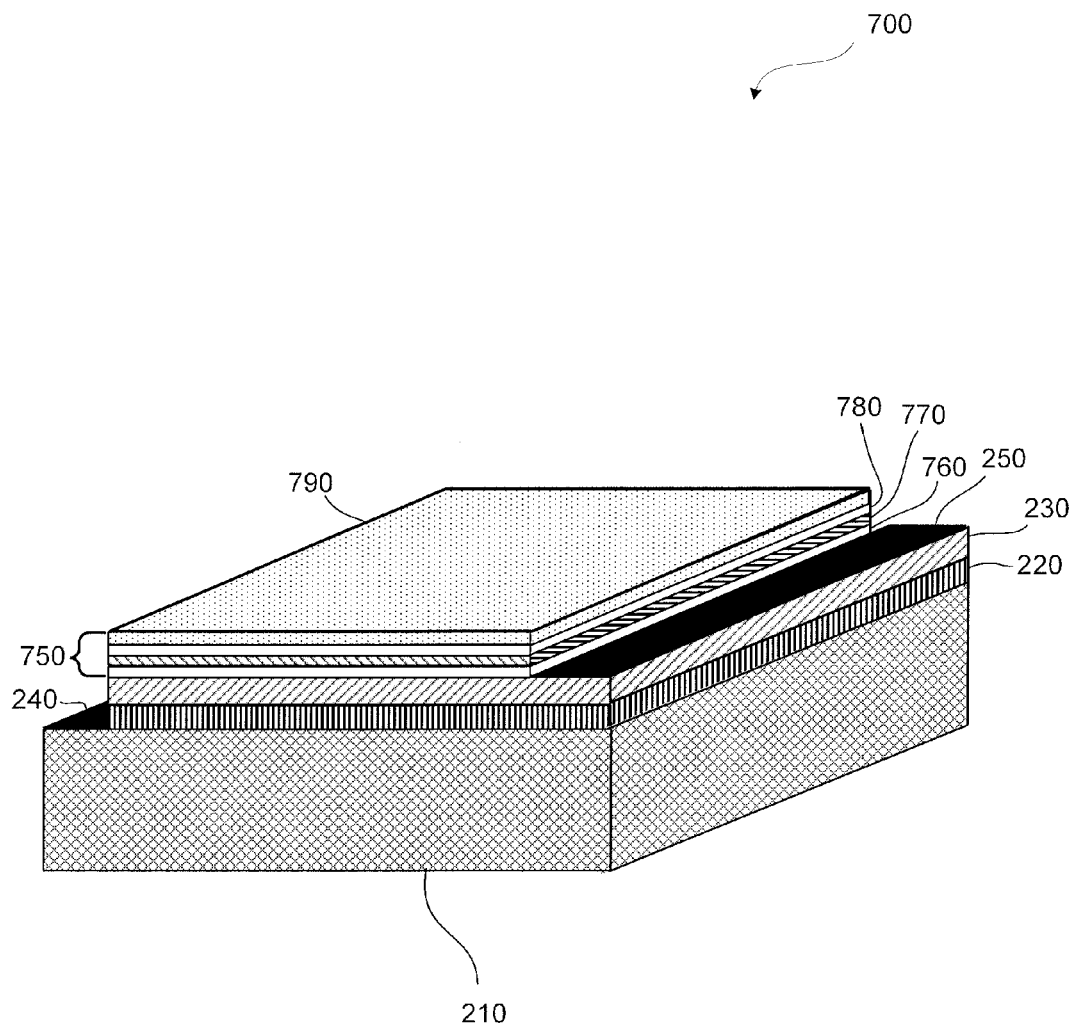
FIG. 7

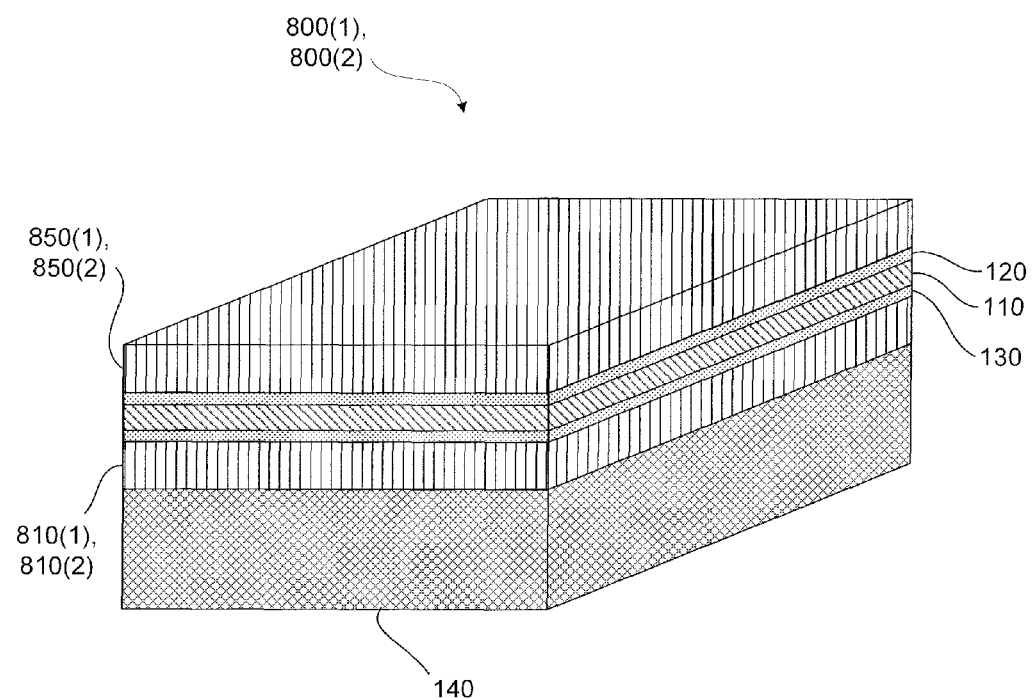
FIG. 8

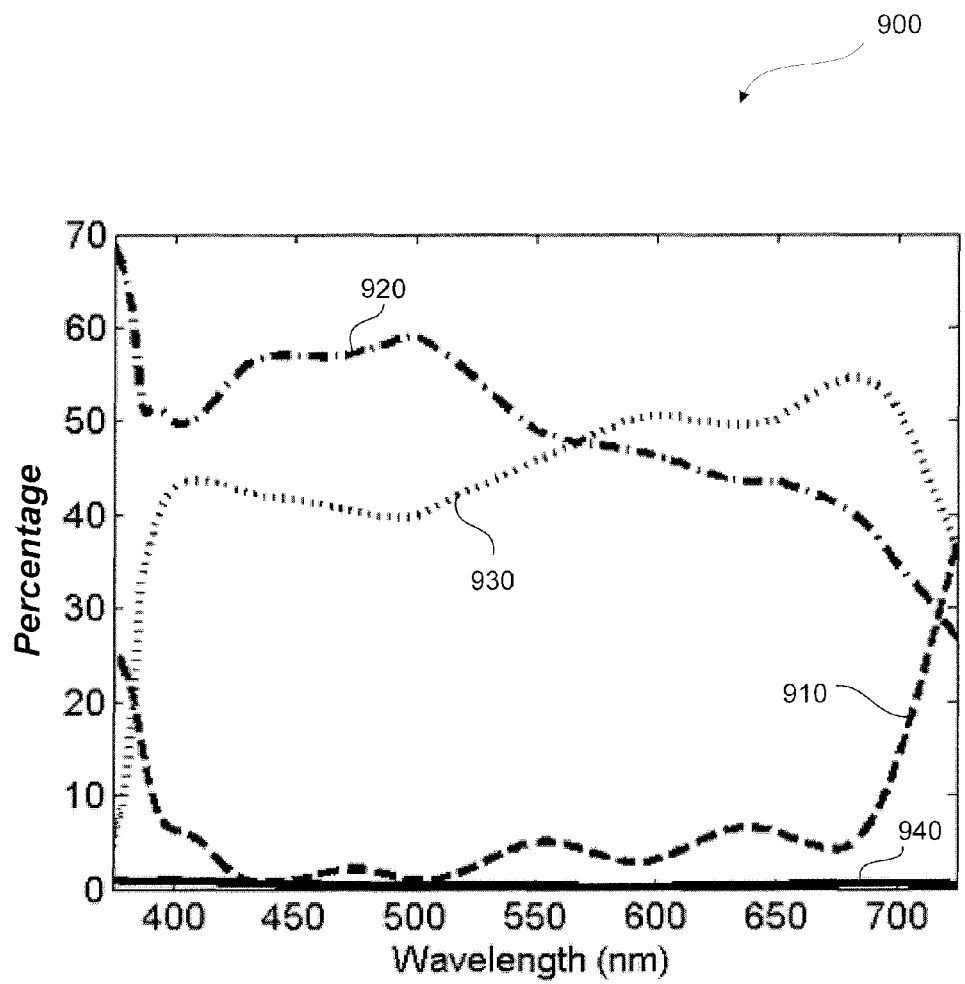
FIG. 9

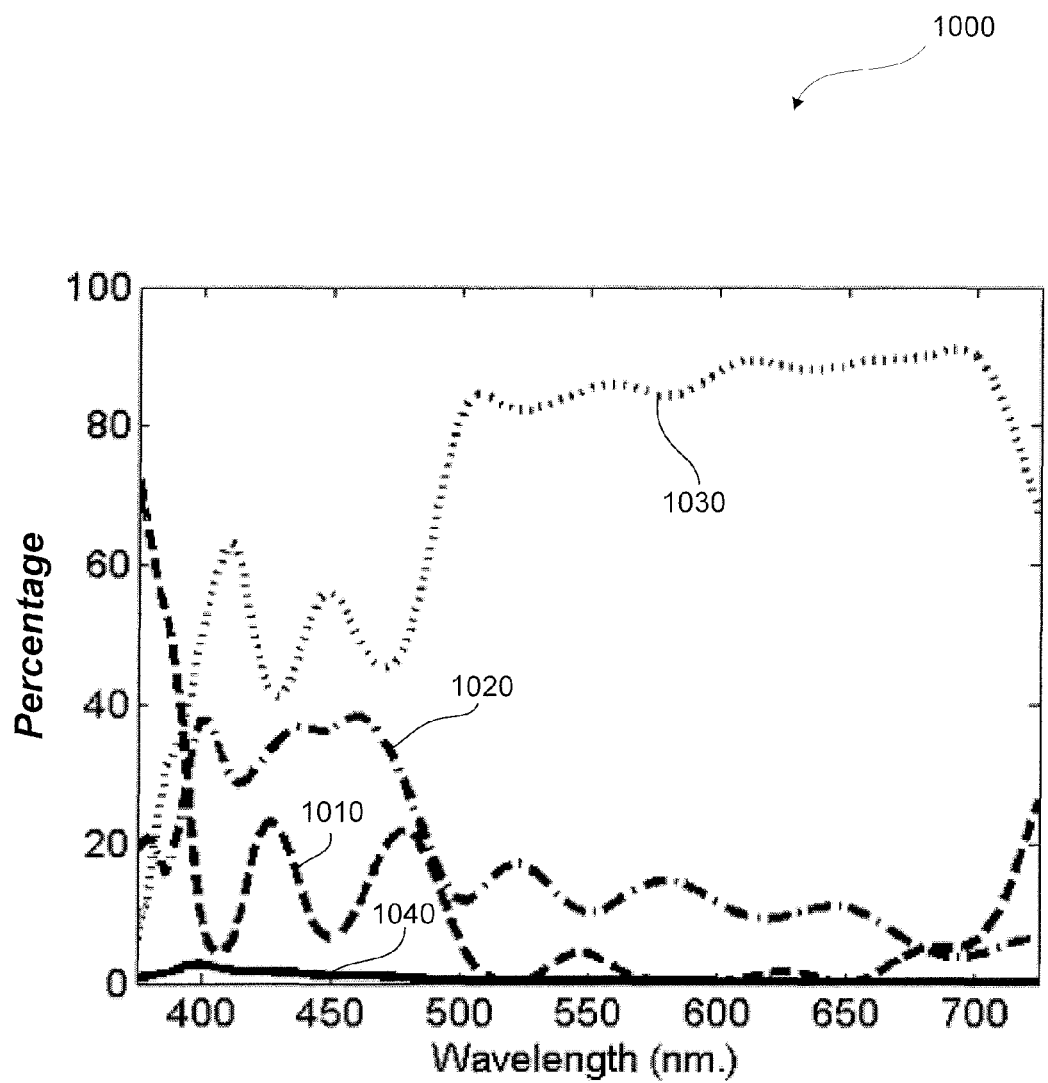
FIG. 10

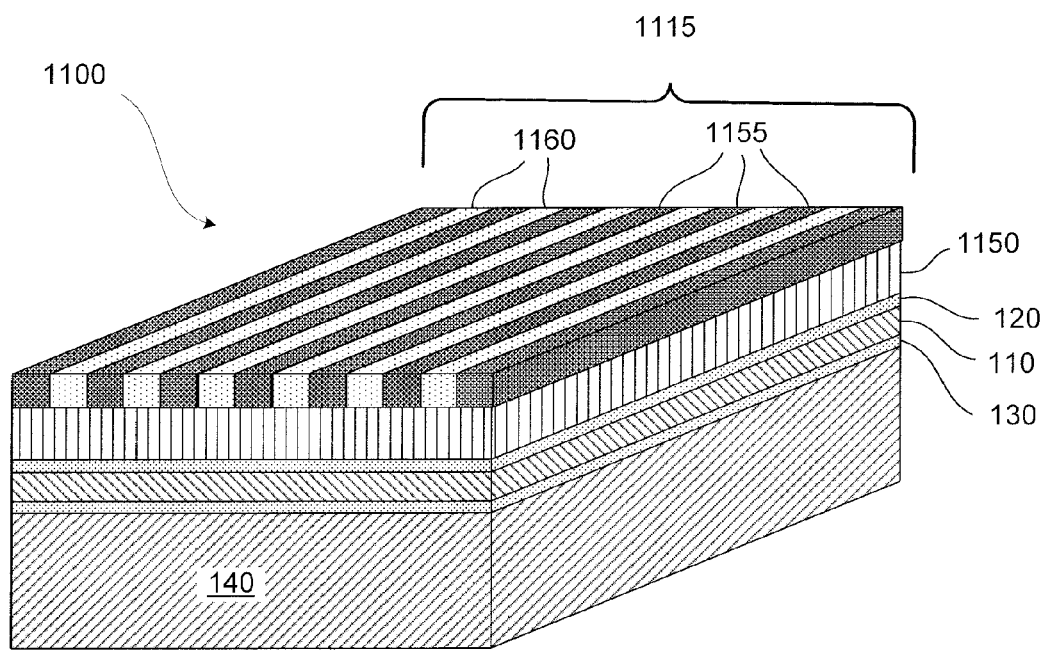
FIG. 11

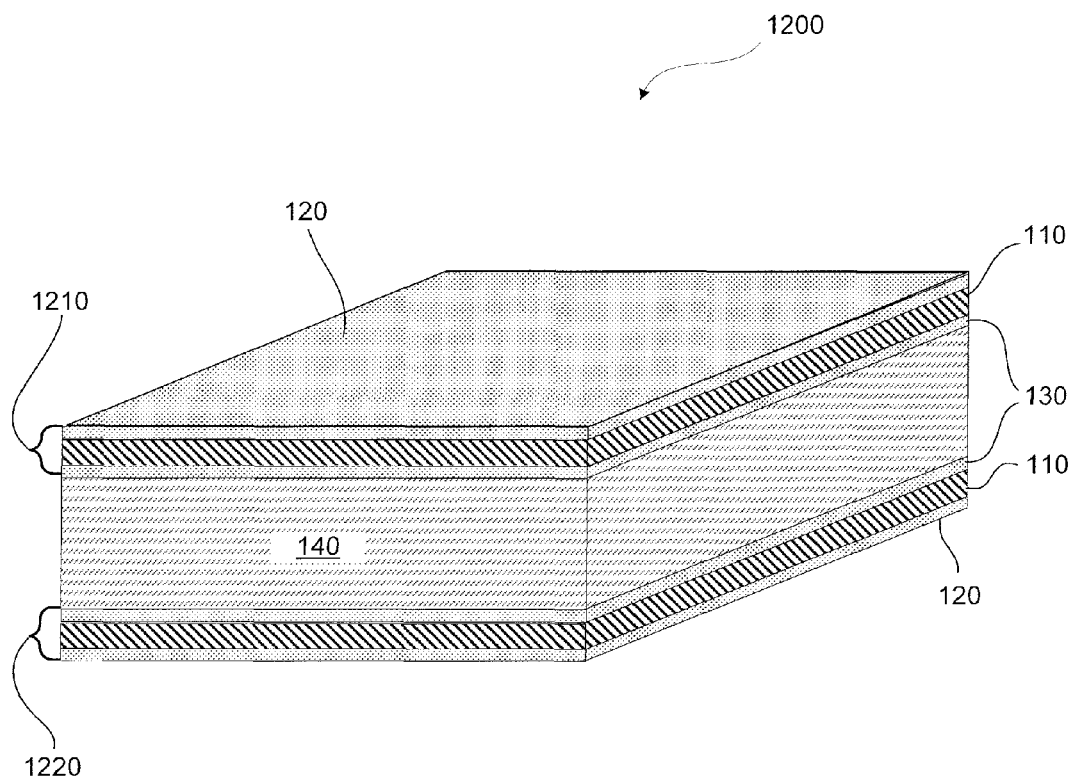
FIG. 12

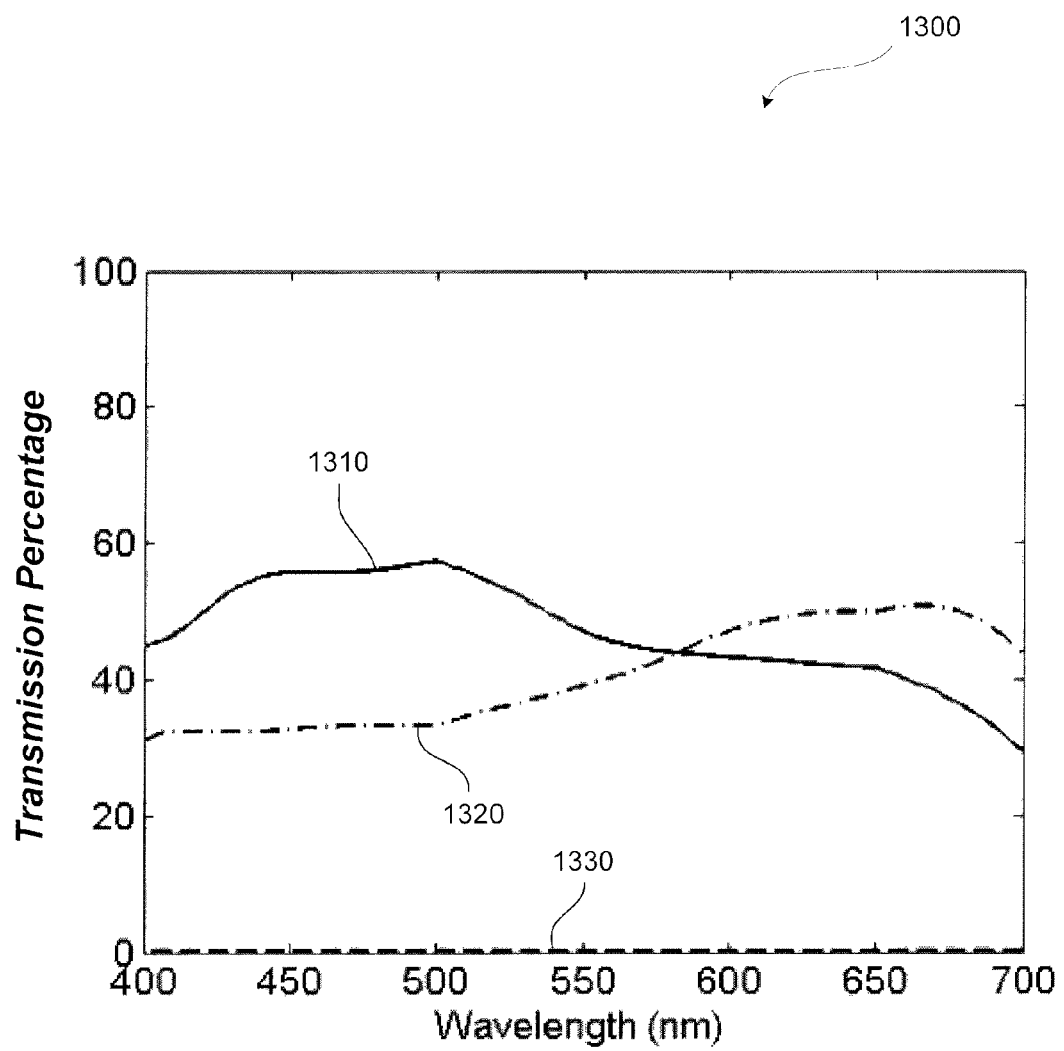
FIG. 13

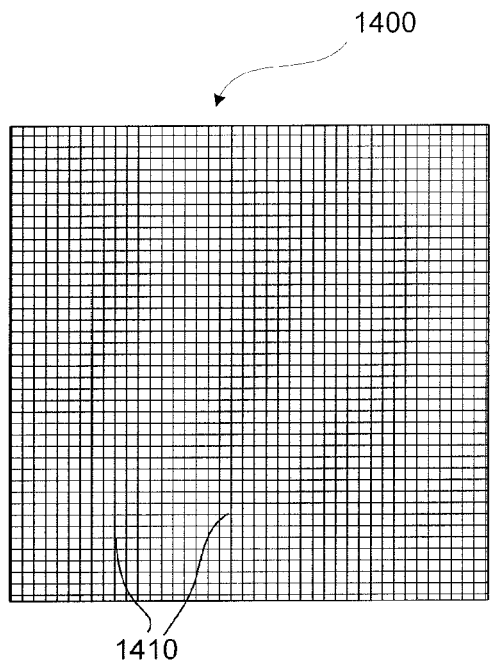
FIG. 14A
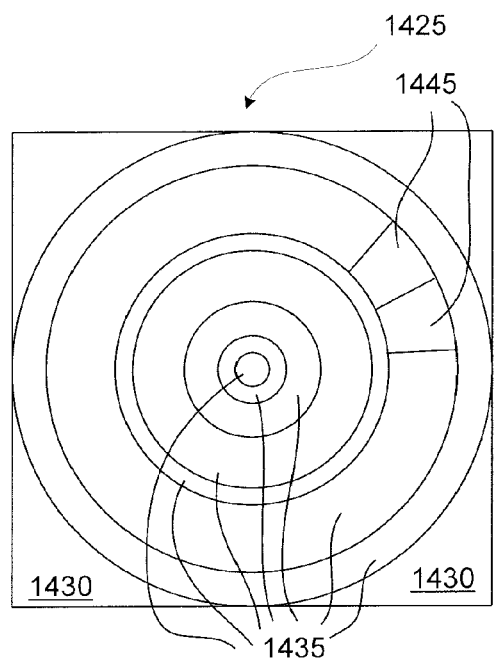
FIG. 14B
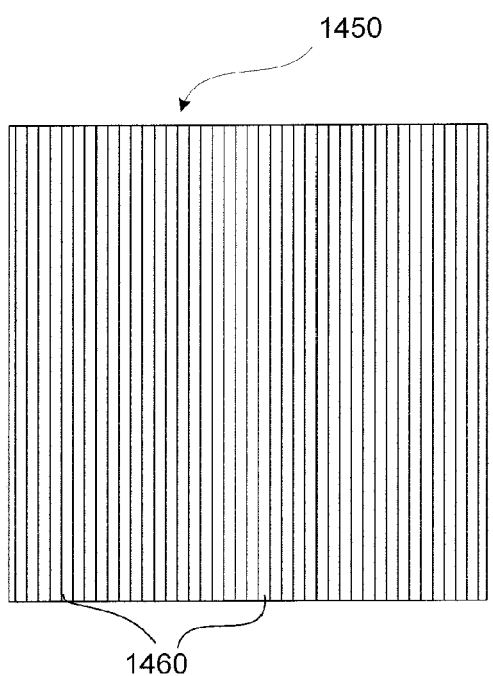
FIG. 14C
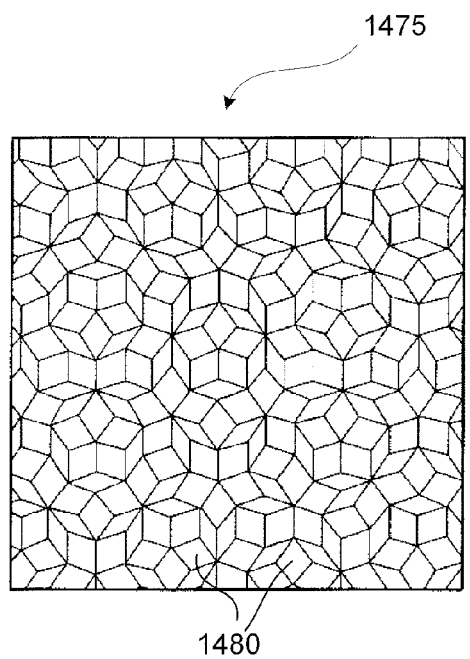
FIG. 14D

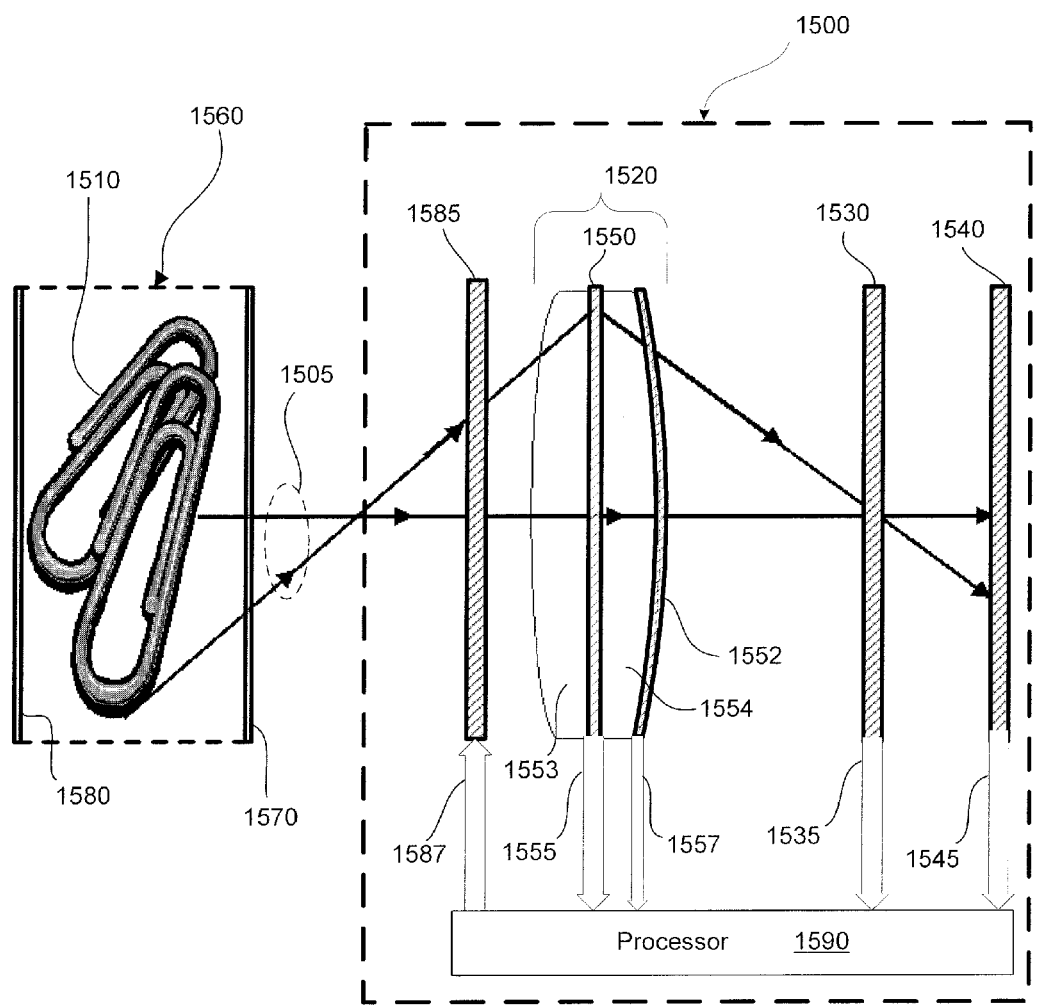
FIG. 15

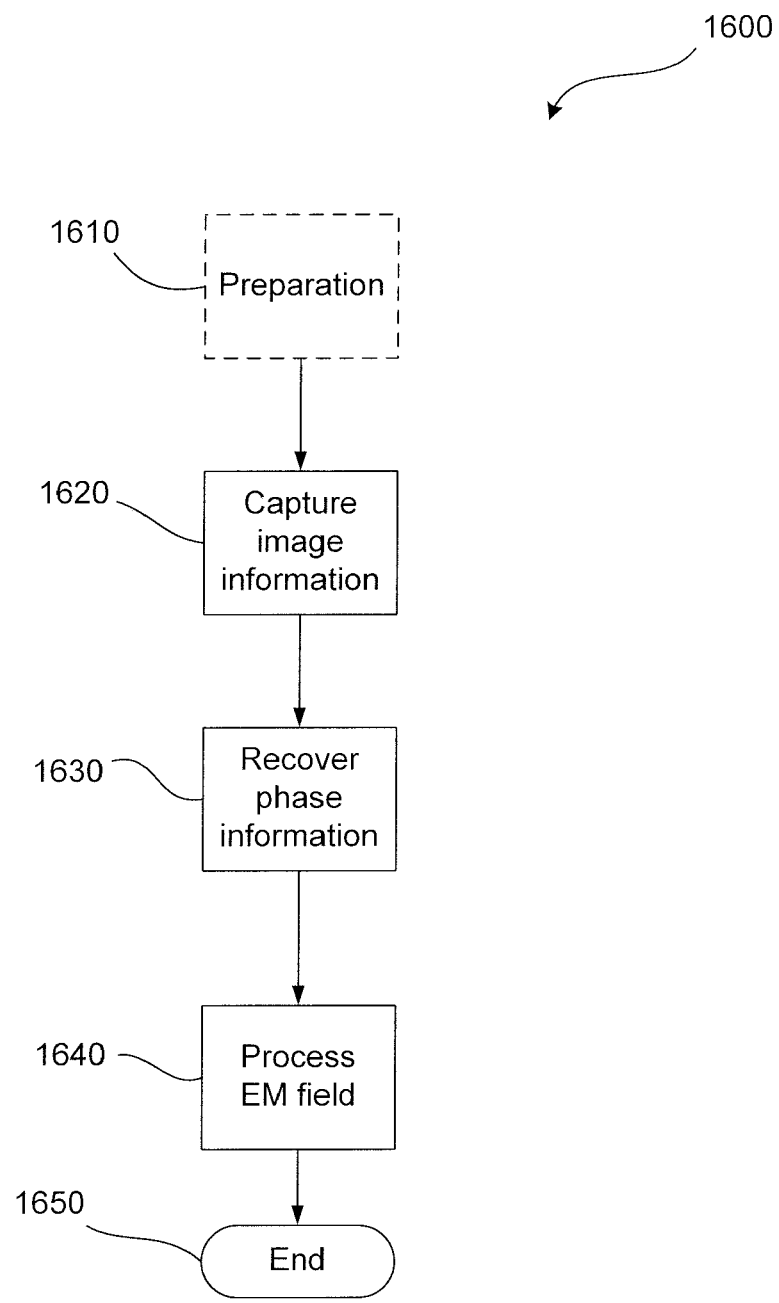
FIG. 16

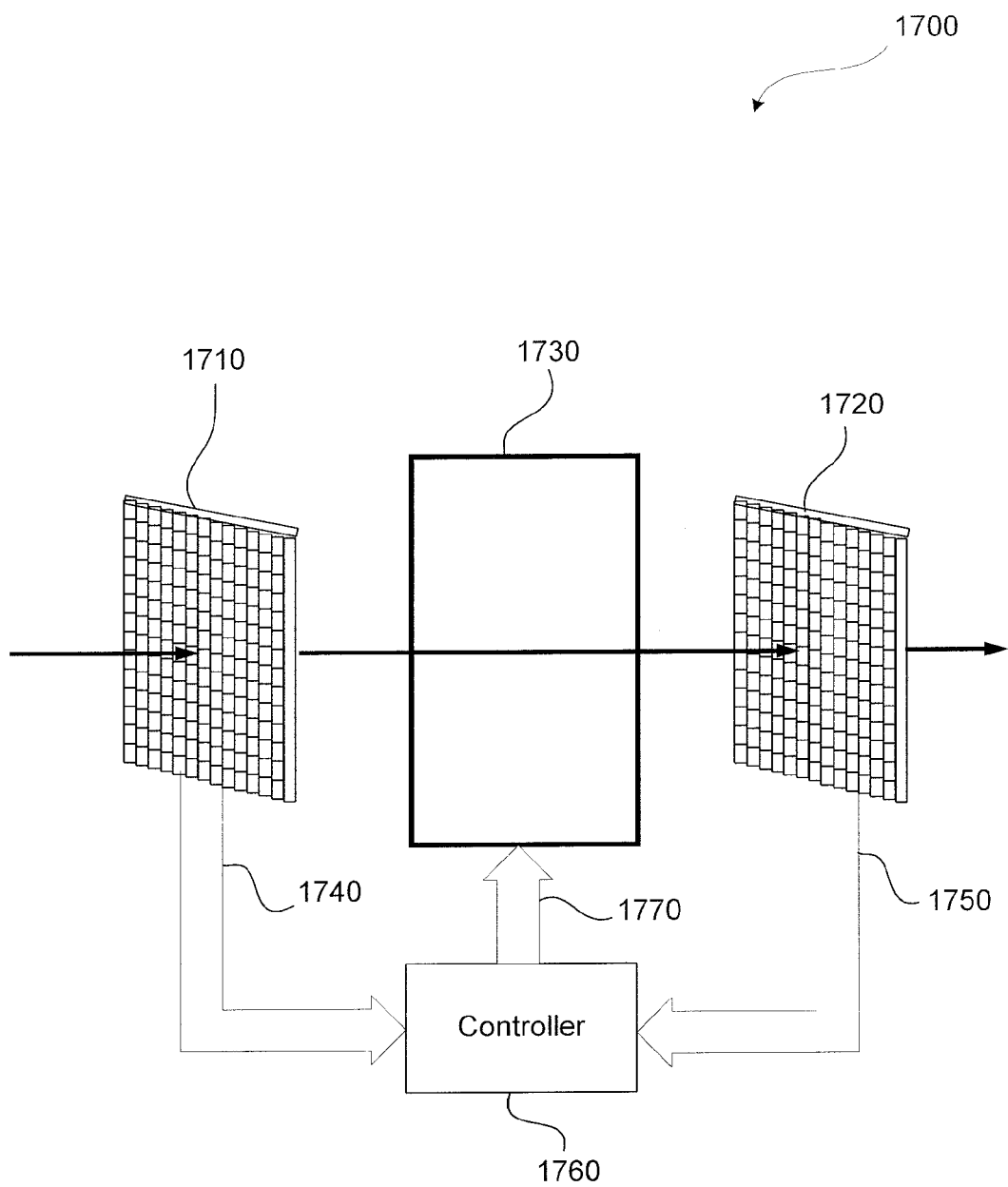
FIG. 17

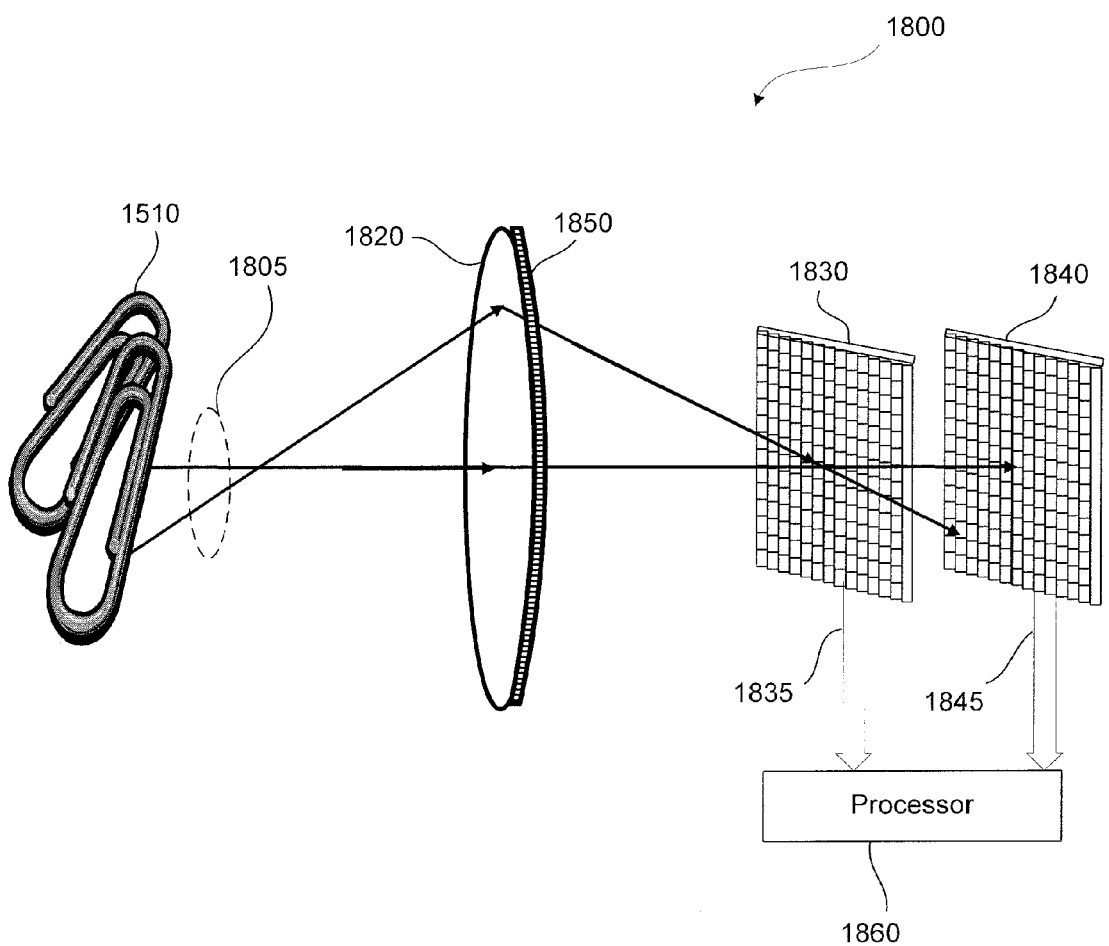
FIG. 18

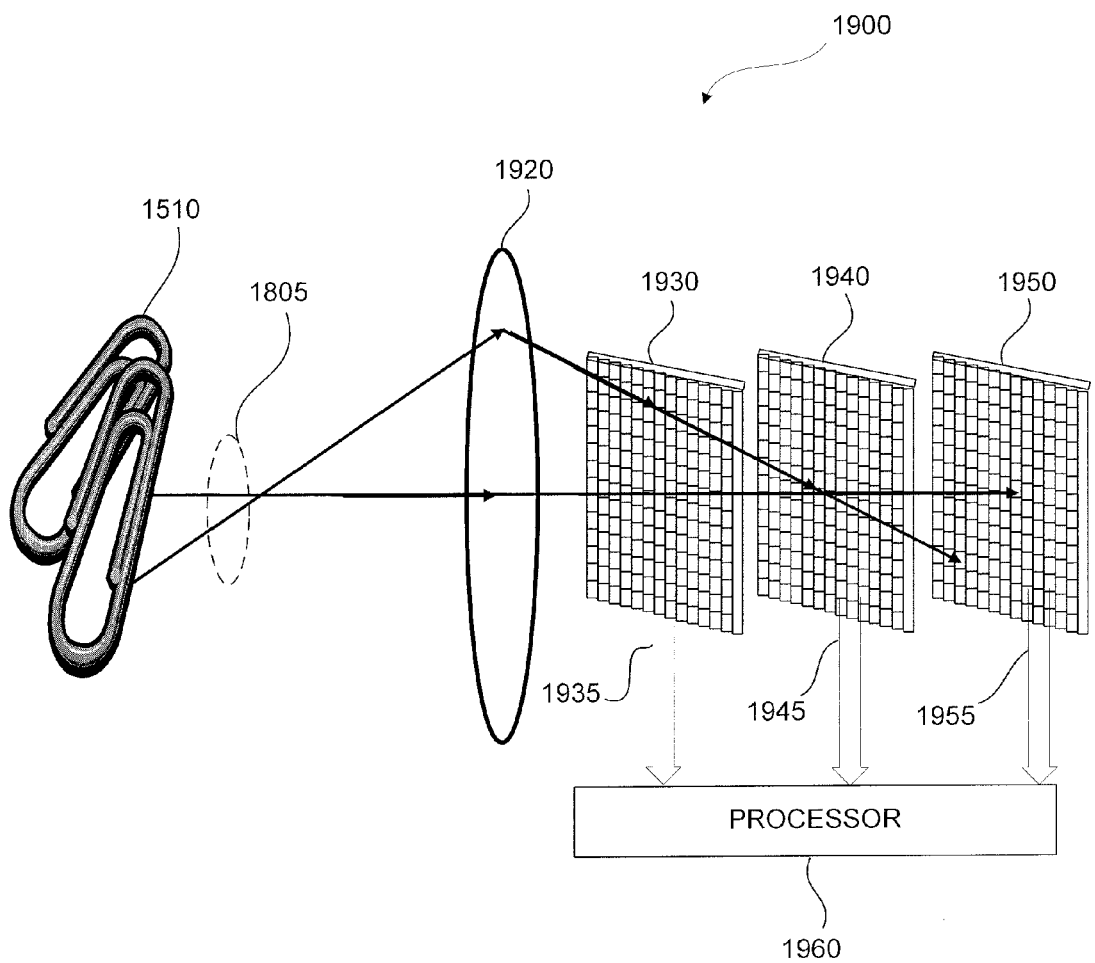
FIG. 19

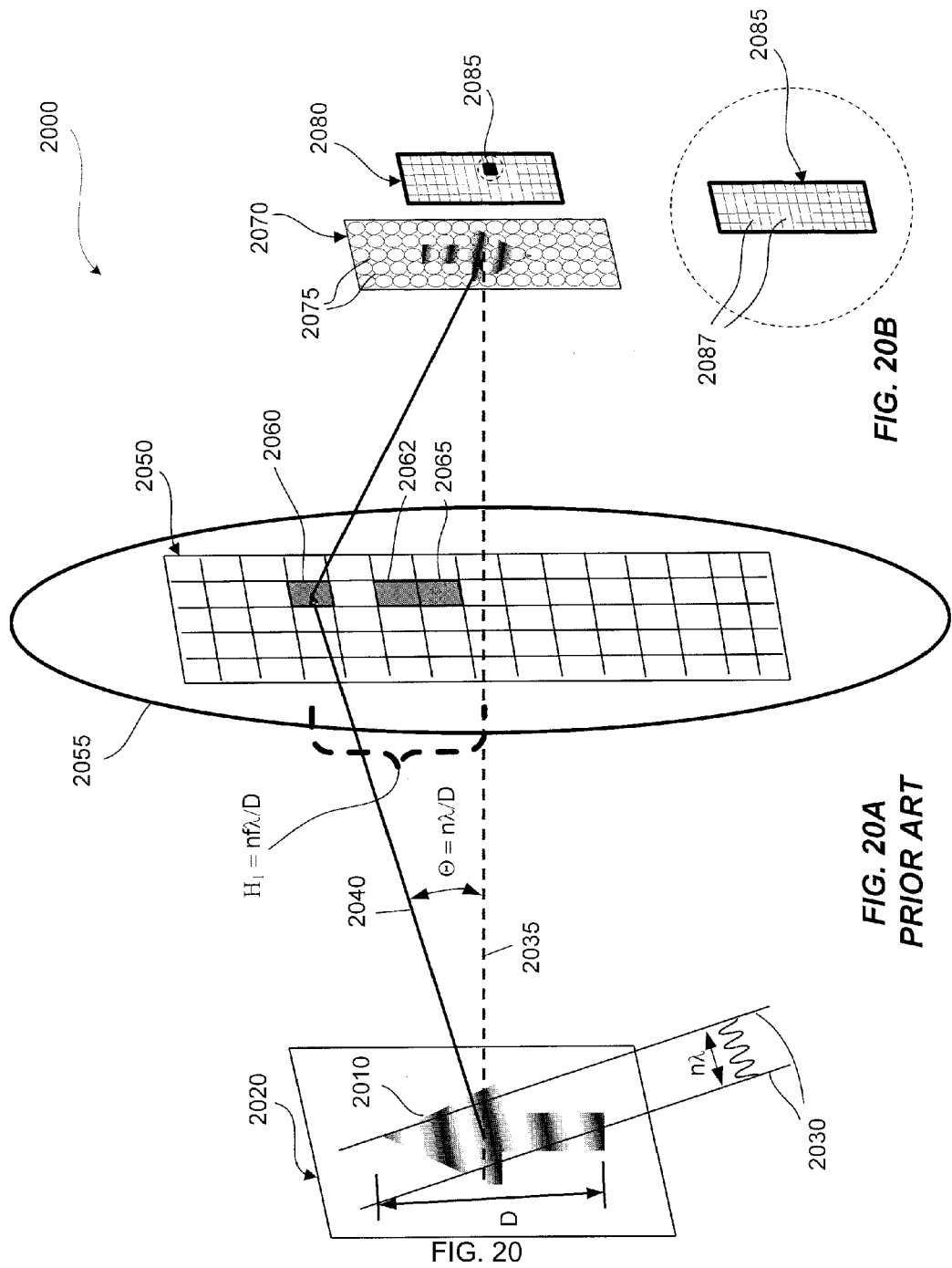
FIG. 20
FIG. 20A
PRIOR ART
FIG. 20B

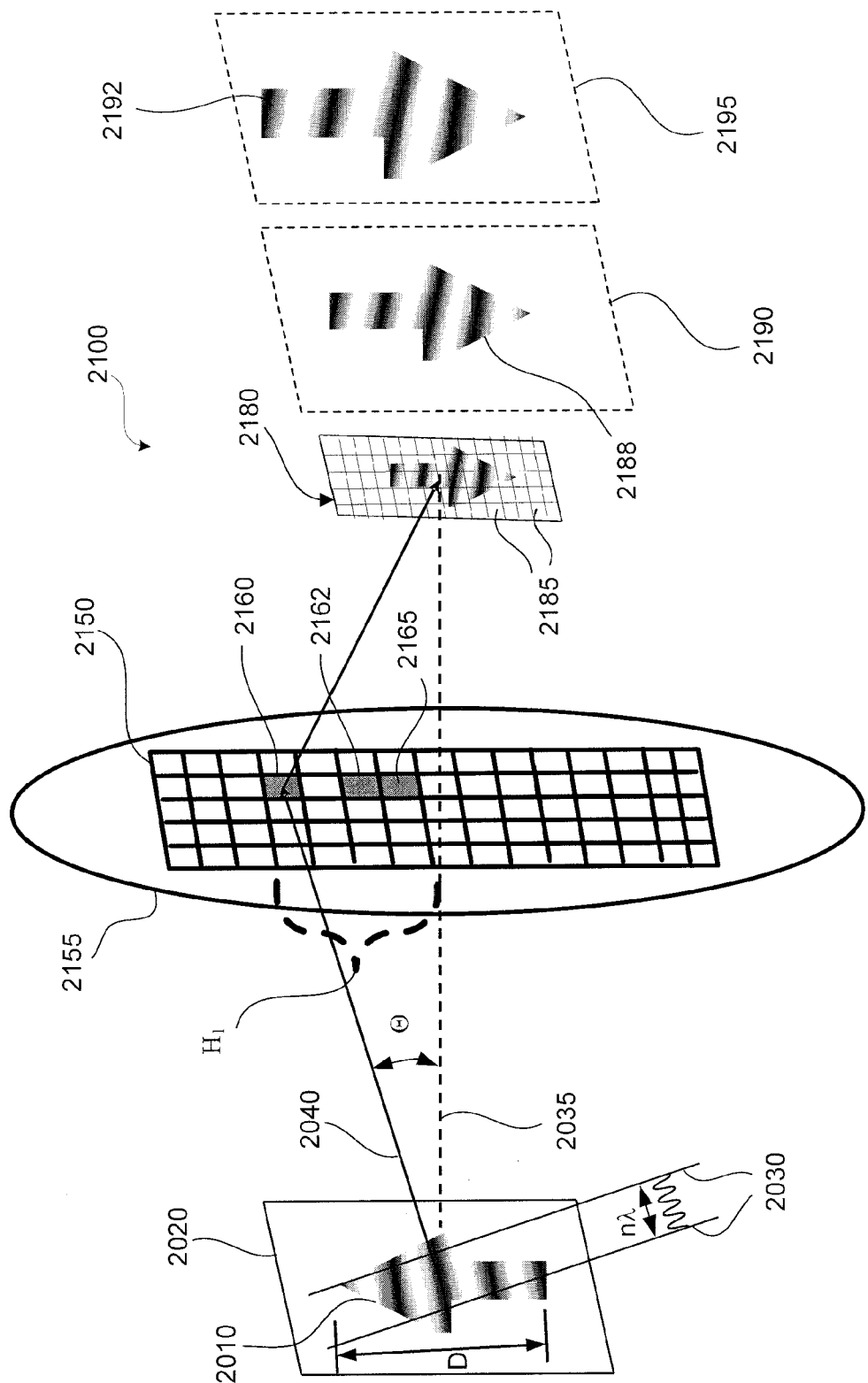
FIG. 21

2200
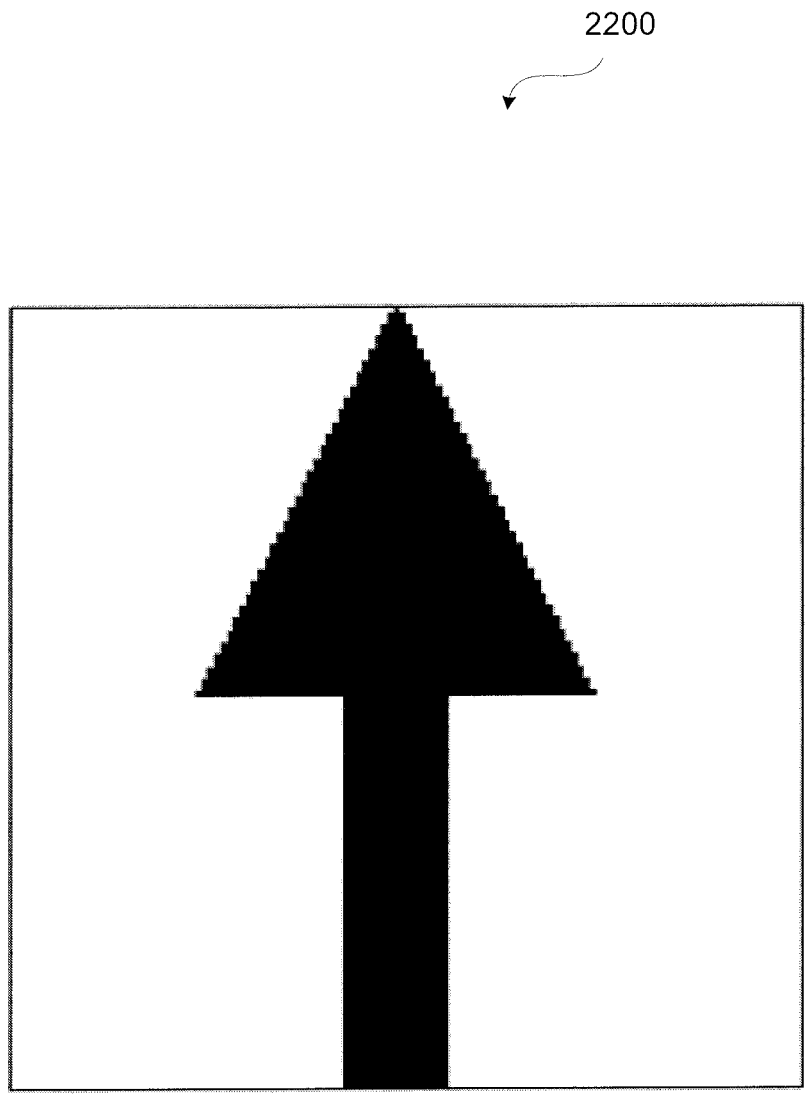
FIG. 22

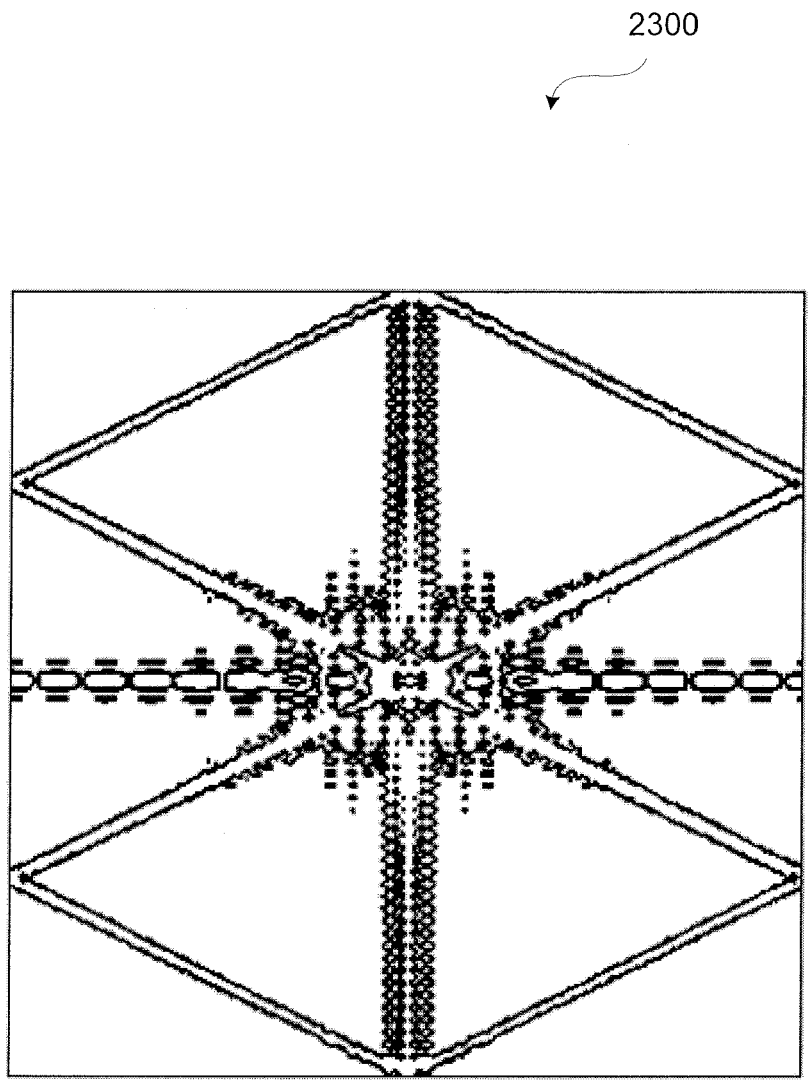
FIG. 23

2400
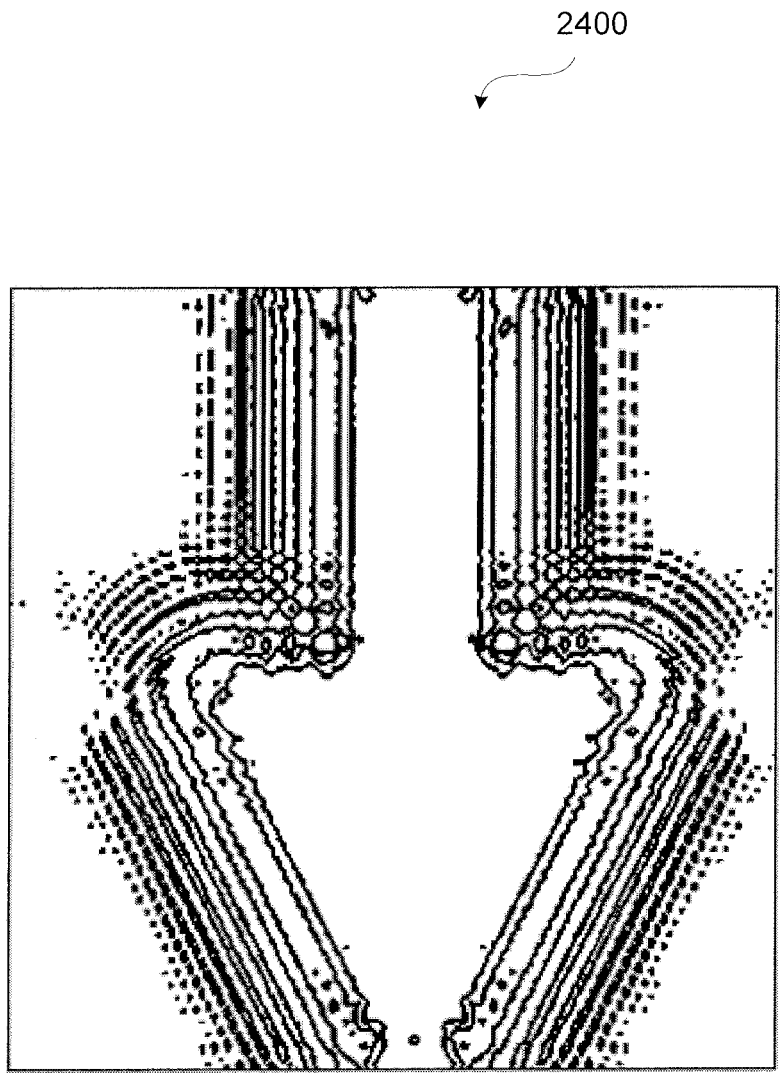
FIG. 24

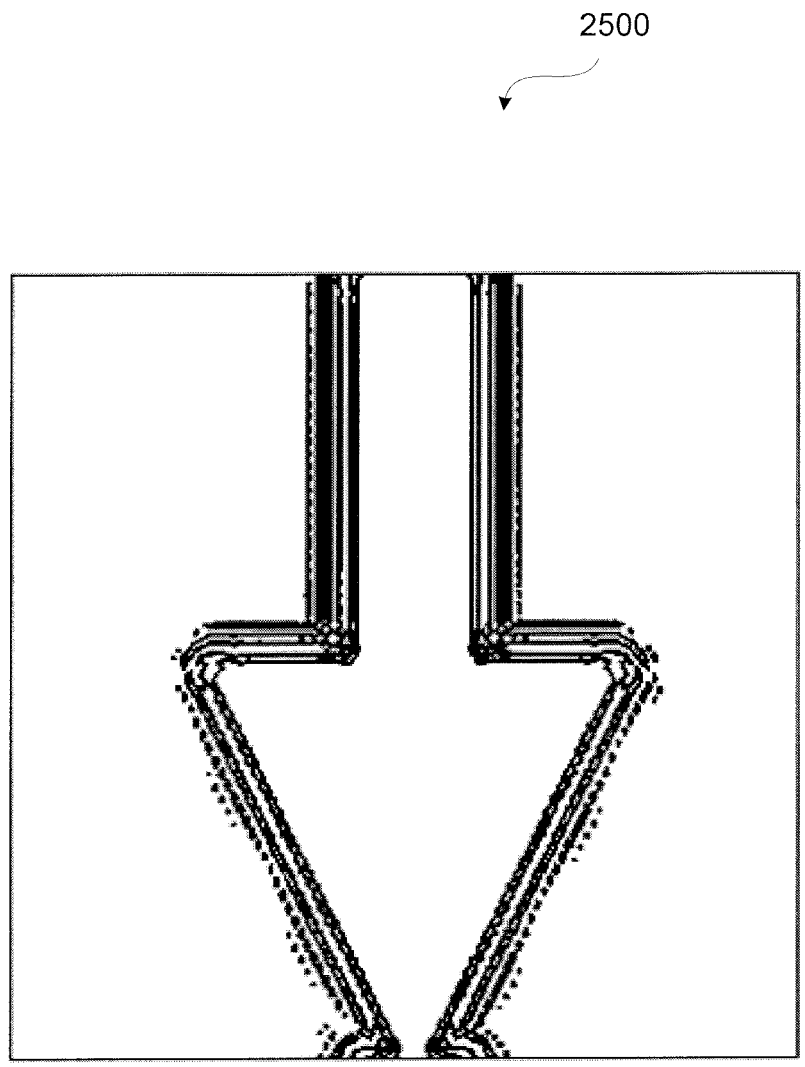
FIG. 25

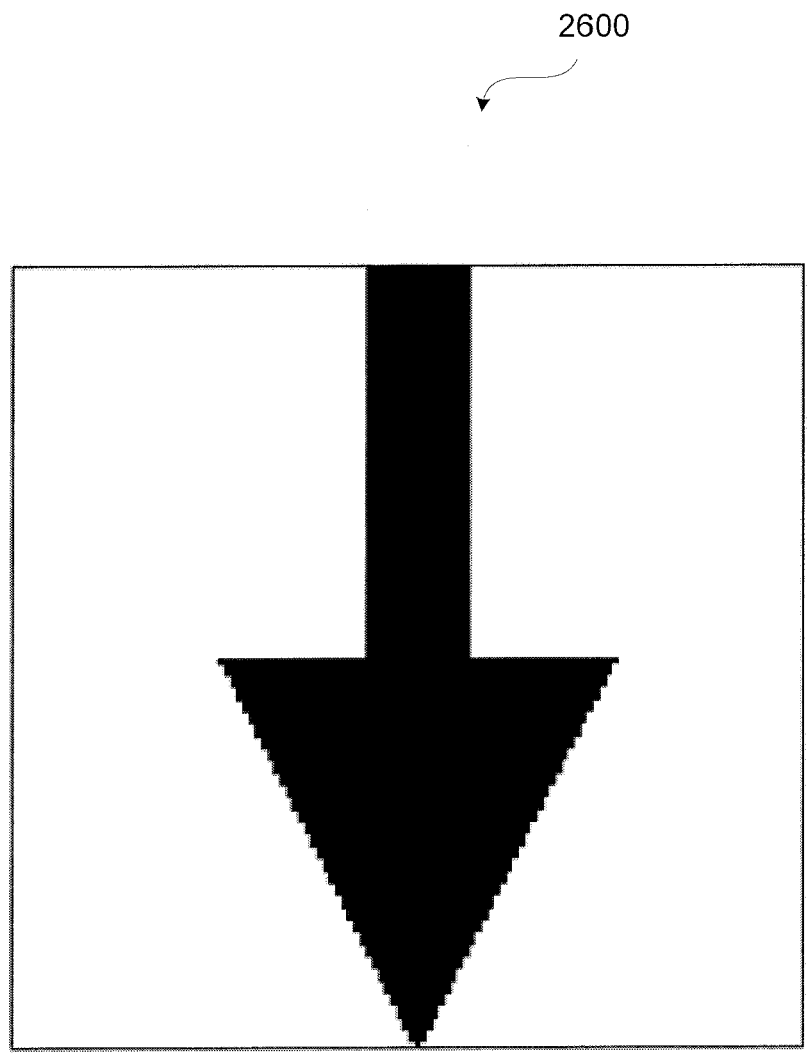
FIG. 26

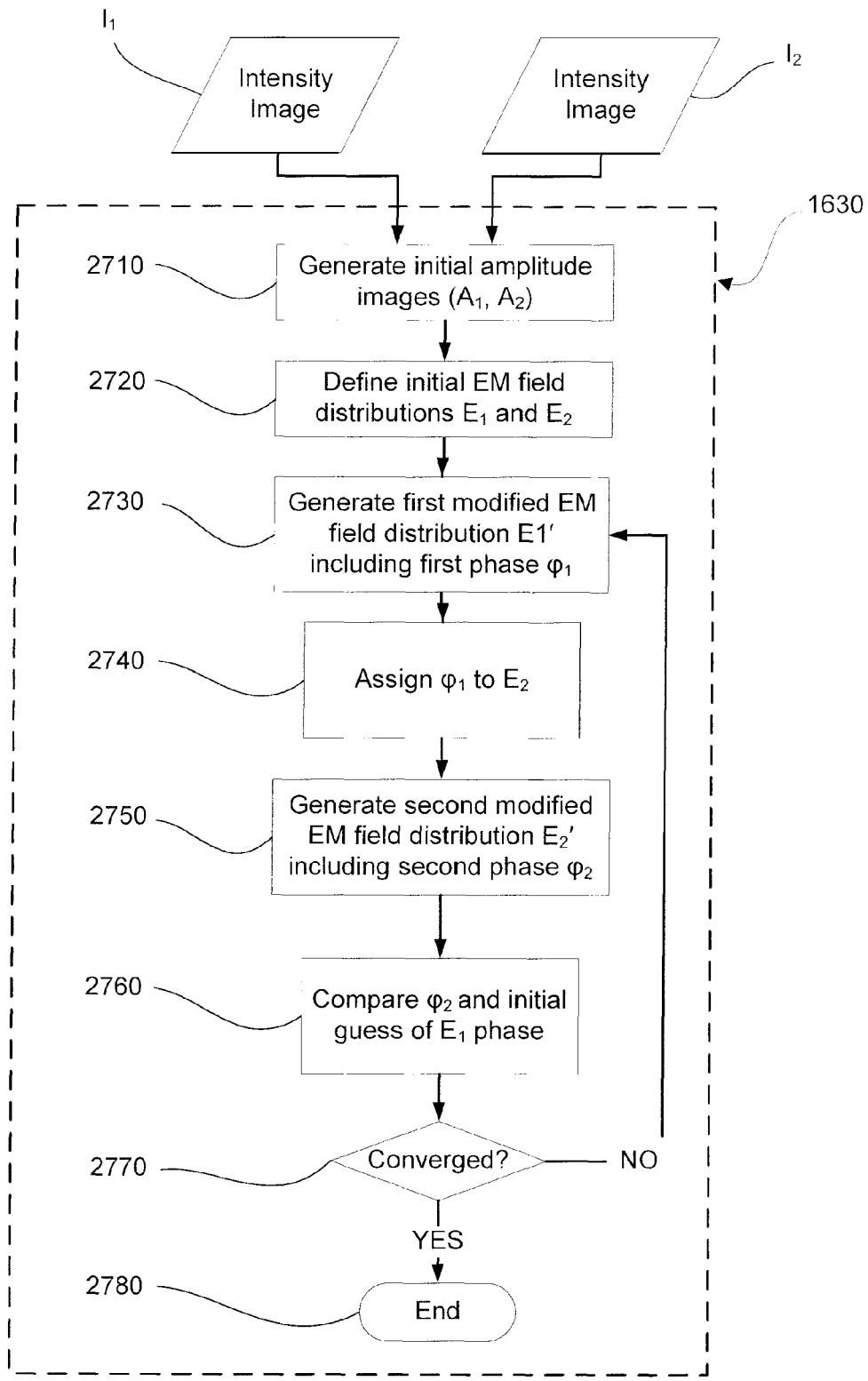
FIG. 27

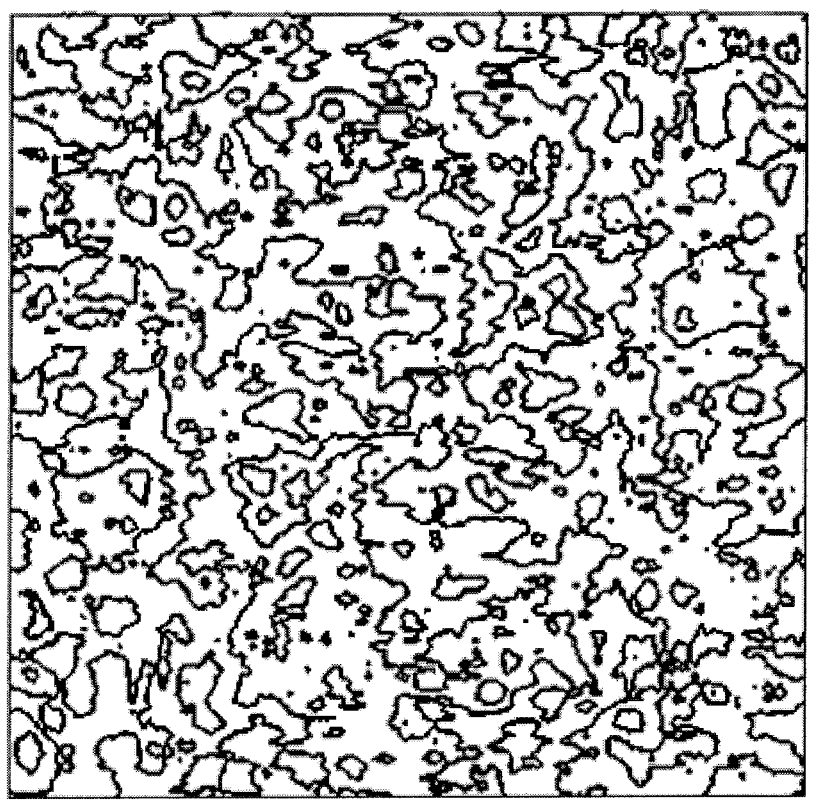
FIG. 28

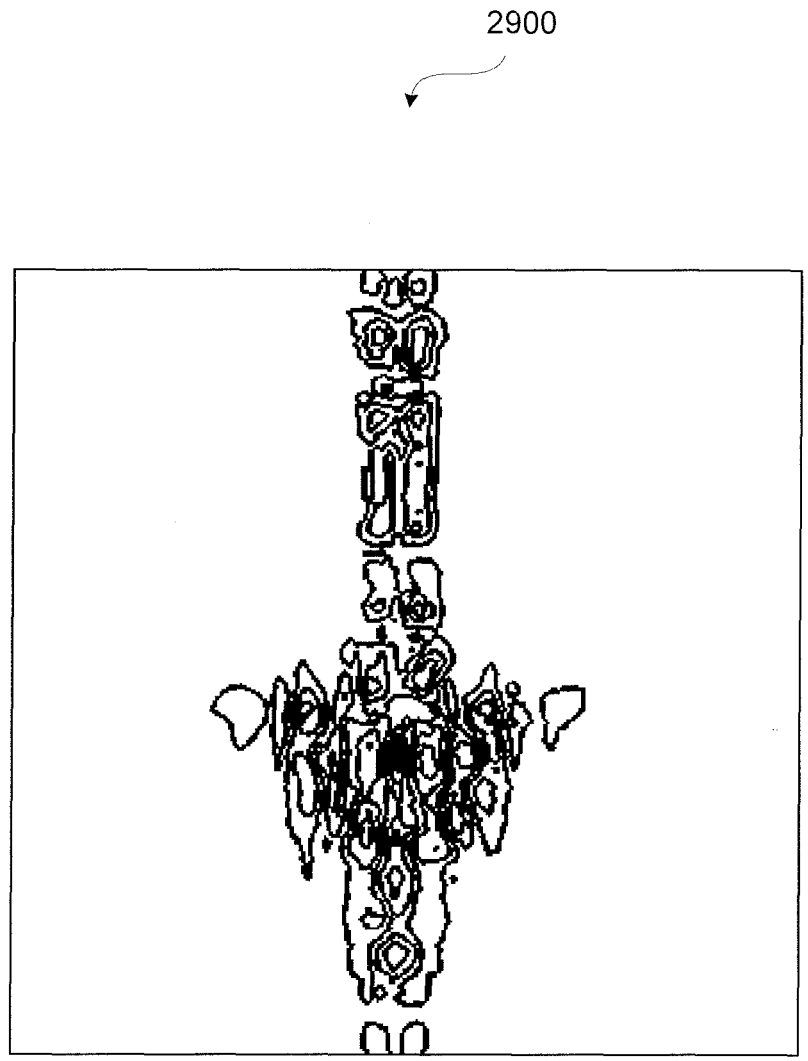
FIG. 29

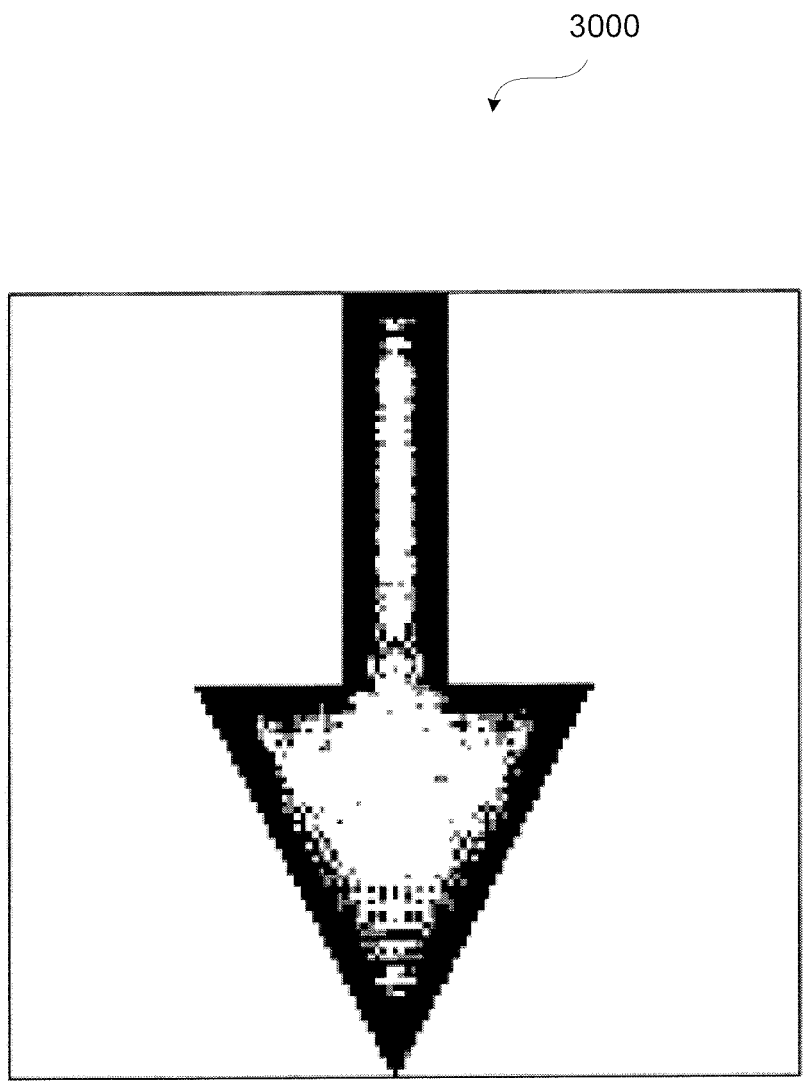
FIG. 30

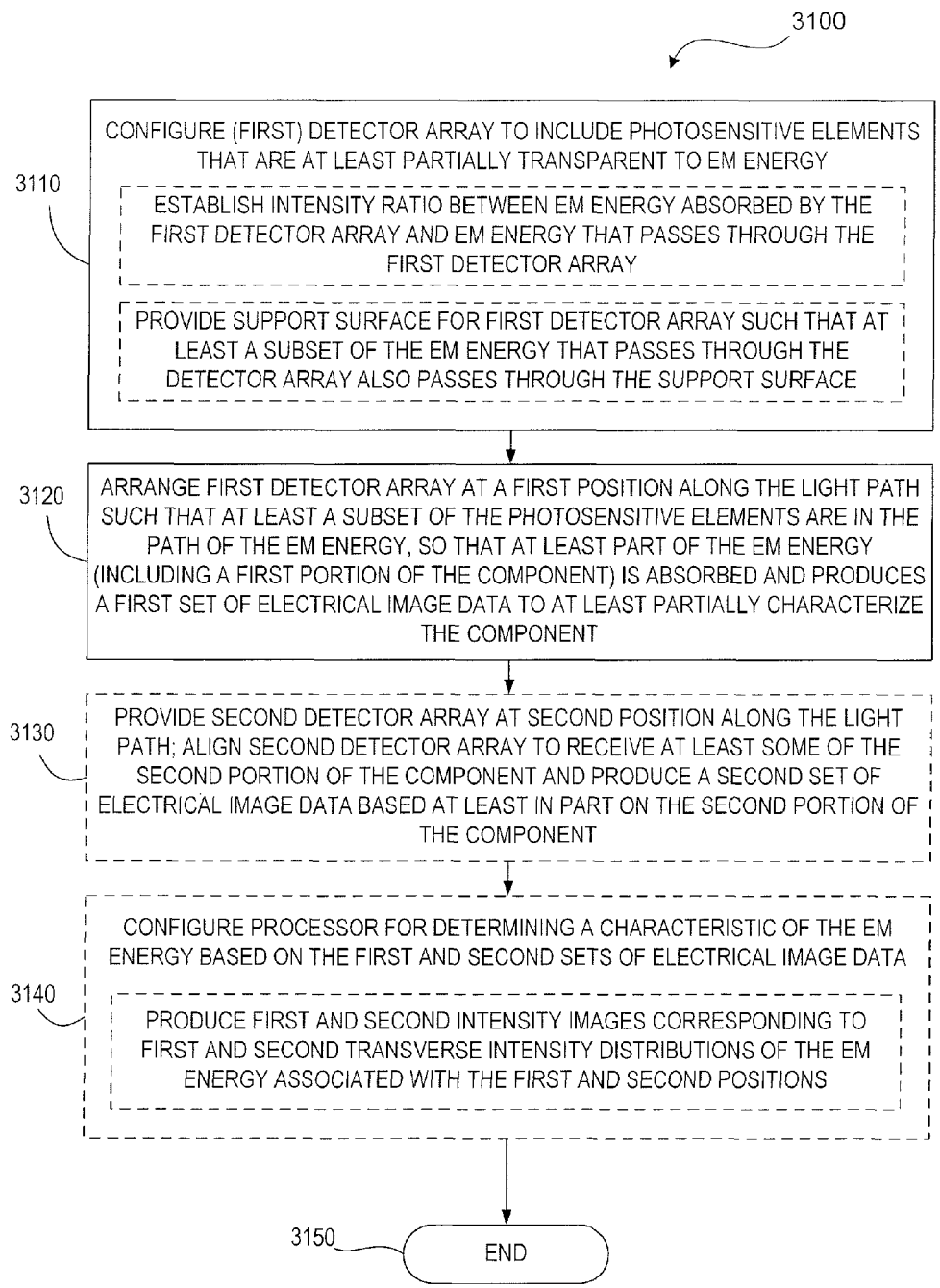
FIG. 31

TRANSMISSIVE DETECTORS, SYSTEMS INCORPORATING SAME, AND ASSOCIATED METHODS

CROSS-REFERENCE TO RELATED APPLICATIONS

This application claims the benefit of priority to commonly-owned U.S. Provisional Patent Application No. 60/971,992, filed 13 Sep. 2007, the disclosure of which is incorporated herein by reference.

BACKGROUND

Many types of photosensitive detectors, such as photodiodes and phototransistors, exist in the prior art. One class of photosensitive detectors includes transmissive and transparent detectors. Transmissive detectors are detectors that are capable of transmitting at least a portion of incident electromagnetic ("EM") energy therethrough. Transparent detectors are a subset of transmissive detectors, further restricted to photosensitive detectors that are capable of transmitting EM energy therethrough with little absorption and no appreciable scattering or diffusion.

U.S. Pat. No. 6,037,644, entitled SEMI-TRANSPARENT MONITOR DETECTOR FOR SURFACE EMITTING LIGHT EMITTING DEVICES, U.S. Pat. No. 6,879,014, entitled SEMITRANSPARENT OPTICAL DETECTOR INCLUDING A POLYCRYSTALLINE LAYER AND METHOD OF MAKING (hereinafter, the "'014 patent") and U.S. Pat. No. 6,670,599, entitled SEMITRANSPARENT OPTICAL DETECTOR ON A FLEXIBLE SUBSTRATE AND METHOD OF MAKING, are incorporated herein by reference in their entireties. Each of these patents describes a semitransparent detector for monitoring the performance of monochromatic optical devices such as a vertical cavity surface-emitting laser ("VCSEL"). The semitransparent detectors described in the aforementioned publications are non-imaging detectors designed to respond to a single wavelength of EM energy and be integrated into the optical device. The '014 patent does note that it is difficult to design and fabricate a transparent detector that simultaneously exhibits good responsivity at a desired wavelength, has low dark current and is highly transparent; however, this document does not discuss possible solutions to these problems outside of the art of VCSEL monitoring.

FIG. 1 is an illustration of a prior art thin film detector 100 that is representative of FIG. 1 of the '014 patent. In accordance with the descriptions of the '014 patent, detector 100 may be utilized for receiving electromagnetic energy that propagates along a light path 10 that is incident, for example, on the upper (exposed) surface of a partially conductive layer 120. Detector 100 may be configured as a semitransparent detector, and may be arranged transversely with respect to light path 10 such that the detector receives at least some of the electromagnetic energy. In other words, the detector can be at least partially transparent with respect to the incident electromagnetic energy, such that a first portion of the incident electromagnetic energy may be absorbed and detected, and a second portion that is not absorbed continues along light path 10 for subsequent use. In thin film detector 100, a photosensitive layer (i.e., a detecting medium) 110 is formed, for instance, from silicon, germanium or other appropriate semiconductor material. At least partially transparent conductive layers 120 and 130 are formed upon two sides of photosensitive layer 110 and may be patterned so that only portions of photosensitive layer 110 are contacted by conductive layers 120 and 130. Conductive layers 120 and 130 are formed from a material such as indium tin oxide ("ITO"), zinc oxide, tin oxide or zinc/tin/indium mixed oxide and are configured to provide electrical contact with photosensitive layer 110. Photosensitive layer 110 and conductive layers 120 and 130 are supported on a substrate 140 that serves as a support arrangement having a support surface over which the aforementioned layers, including photosensitive layers 110, may be formed. Using well-known techniques substrate 140 may be, for example, formed from a transmissive dielectric material such as glass or silicon dioxide. Photosensitive layer 110 may include a number of sublayers (not shown) such as a transmissive p-type layer (P), an intrinsic (e.g., undoped) semiconductor (I), and an n-type semiconductor (N), and these layers may be configured according to well known techniques as a "PIN" diode for absorbing light and producing an electrical signal based on the absorbed light. As discussed in the '014 patent, the sublayers may be formed by sequential deposition of each layer, and/or selective masking and doping of one or more deposited semiconductor materials. While thin film detectors can be relatively inexpensive to fabricate, they often suffer from excessive noise, large dark currents and low sensitivity particularly when amorphous semiconductor materials are used to form the PIN diode.

As described in the '014 patent, the EM energy may propagate along light path 10 that is oriented in an upward direction, and may therefore be incident on the lower surface (not shown) such that it may be received by the detector.

FIG. 2 is an illustration of a prior art thinned detector 200. Thinned detector 200 may include sub-layers of thinned crystalline material and, like thin film detector 100 (FIG. 1), can be configured to form a PIN diode. In particular, thinned detector 200 may include a p-type semiconductor substrate 210 that can be thinned by mechanical and/or chemical means, supporting an intrinsic semiconductor layer 220 and an n-type semiconductor layer 230 formed thereon. P-type semiconductor substrate 210 can be formed from a thick (e.g., hundreds of microns) crystalline semiconductor substrate that is chemically and/or mechanically thinned (e.g., to a final thickness of about 10 microns or less) to provide appropriate optical characteristics for a given application. Thinned detector 200 may be lithographically patterned and etched, using well-known techniques, to remove portions of layers 220 and 230 to accommodate a p-contact 240, which provides an electrical contact with p-type semiconductor substrate 210. An n-contact 250 can be deposited onto n-type semiconductor layer 230. P-contact 240 and n-contact 250 can be formed from aluminum or other suitable conductive materials known in the art. The thinning operation itself, as well as yield losses due to damage of thinned substrates, may contribute to a higher final cost of a thinned detector as compared to the final cost of a thin film detector such as that shown in FIG. 1.

FIG. 3 shows an exemplary plot 300 of simulated spectral performance associated with one example of prior art thin film detector 100 fabricated according to FIG. 1 and the description thereof. Plot 300 may, for example, be generated based on the device specifications disclosed in the '014 patent, and has wavelength in nanometers as the abscissa and percentage as the ordinate. Overall reflectance 310 of thin film detector 100 is represented by a dashed line, and absorptance 320 of photosensitive layer 100 alone is represented by a dash-dot line. Transmittance 330 through thin film detector 100 is represented by a dotted line, and absorptance 340 of all other layers of thin film detector 100 other than photosensitive layer 110 is represented by a solid line. Based on plot 300, thin film detector 100 may be considered inefficient since an average value of reflectance 310 is greater than 50%. Furthermore, an average value of absorptance 320 is less than 30% and exhibits pronounced spectral dependence due to material properties and solid etalon effects in the detector structure.

Although thin film detector 100 and thinned detector 200 may provide adequate detection for EM energy of a single wavelength for a given application, such as monochromatic optical device monitoring, their spectral dependence (as demonstrated, for example, in FIG. 3) makes them unsuitable for uniform broadband detection. Additionally, loss of incident EM energy due to reflection contributes to reduced signal-to-noise ratio ("SNR") of the thin film and thinned detectors.

Outside the art of monochromatic optical device monitoring, an application for a thin film silicon detector includes a highly transparent phase detector that detects the EM energy intensity along standing waves for high precision measurement of position or wavelength. Examples of such applications are described in Jun et al., "Optimization of Phase-Sensitive Transparent Detector for Length Measurements," IEEE Trans. Electr. Dev., 52, No. 7 (2005), pp. 1656-1660, Li et al., "Precision optical displacement sensor based on ultra-thin film photodiode type optical interferometer," Meas. Sci. & Tech., 14 (2003), pp. 479-483 and Knipp et al., "Silicon-Based Micro-Fourier Spectrometer," IEEE Trans. Electr. Dev., 52, No. 3 (2005), pp. 419-426, which are incorporated by reference herein in their entireties. Transparent phase detectors of these types are designed to minimally impact the incident EM energy and therefore detect only a very small fraction of the incident energy; that is, such transparent phase detectors are intended to absorb only as little incident EM energy as needed to perform the phase detection task. While the detectors described in the foregoing documents (including the '014 patent) may be configured to absorb and detect a first portion of incident electromagnetic energy, and to transmit a second portion for subsequent use, those detectors are configured to absorb a fraction of overall power of the incident radiation. Therefore, such detectors absorb the first portion of the incident electromagnetic radiation in a manner that is not selective with respect to specific characteristics of the electromagnetic energy. While these prior art detectors may exhibit well known spectral characteristics based on material properties and other conventional features of the detector, the absorption characteristics of the foregoing detectors are not selective with respect to specific characteristics of the electromagnetic energy such as wavelength and/or polarization.

SUMMARY

The following embodiments and aspects thereof are described and illustrated in conjunction with systems, tools and methods that are meant to be exemplary and illustrative, not limiting in scope.

In one embodiment, a detector assembly is configured for characterizing electromagnetic energy that propagates along a light path. At least a component of the electromagnetic energy carries electromagnetic energy information along the light path. The detector assembly includes a first detector array arranged along the light path and having photosensitive elements aligned to receive at least some of the electromagnetic energy, including the component. The photosensitive elements selectively absorb a first portion of the component and produce a first set of electrical image data, based at least in part on the electromagnetic energy information, in response to the component. At least some of the photosensitive elements are at least partially transparent so that they selectively pass a second portion of the component along the light path to continue along the light path.

In another embodiment, a method characterizes electromagnetic energy that propagates along a light path. The electromagnetic energy has a component that carries electromagnetic energy information along the light path. The method includes configuring a first detector array to include photosensitive elements that are at least partially transparent with respect to the electromagnetic energy. The method also includes arranging the first detector array along the light path such that at least a subset of the photosensitive elements are in the path of the electromagnetic energy to (i) selectively absorb at least some of the electromagnetic energy including a first portion of the component of the electromagnetic energy that carries the electromagnetic energy information and producing therefrom a first set of electrical image data to at least partially characterize the component of electromagnetic energy information, and (ii) selectively pass, through the transmissive photosensitive elements, a second portion of the component such that the second portion continues along the light path for a subsequent use.

In another embodiment, a method is described for characterizing electromagnetic energy that propagates along a light path. The electromagnetic energy includes a component that carries electromagnetic energy information along the light path. The method includes, at a first position on the light path, absorbing at least some of the electromagnetic energy including a first controlled portion of the component of the electromagnetic energy that carries the electromagnetic energy information and producing therefrom a first set of electrical image data. The method also includes transmissively passing a second controlled portion of the component such that the second controlled portion continues along the light path.

In addition to the exemplary aspects and embodiments described above, further aspects and embodiments will become apparent by reference to the drawings and by study of the following descriptions.

BRIEF DESCRIPTION OF THE DRAWINGS

It is noted that, for purposes of illustrative clarity, certain elements in the drawings may not be drawn to scale, simplified and/or contrast enhanced.

FIG. 1 is a diagrammatic illustration, in partial elevation, of a prior art thin film detector.

FIG. 2 is a diagrammatic illustration, in partial elevation, of a prior art thinned detector.

FIG. 3 shows a plot of simulated spectral performance associated with one example of the prior art thin film detector of FIG. 1.

FIG. 4 shows a plot illustrating an example of partitioning and measurement of EM energy information, in accordance with an embodiment.

FIG. 5A is a schematic illustration, in partial elevation, of a transmissive detector, in accordance with an embodiment.

FIG. 5B is an enlarged illustration of a portion of the transmissive detector of FIG. 5A.

FIG. 6 shows a plot of simulated spectral performance of the transmissive detector of FIG. 5A.

FIG. 7 is a diagrammatic illustration, in partial elevation, of another transmissive detector, in accordance with an embodiment.

FIG. 8 is a diagrammatic illustration, in partial elevation, of two transmissive detectors, in accordance with an embodiment.

FIG. 9 shows a plot of simulated spectral performance of one of the transmissive detectors of FIG. 8, in accordance with an embodiment.

FIG. 10 is a plot of simulated spectral performance of another of the transmissive detectors of FIG. 8, in accordance with an embodiment.

FIG. 11 is a diagrammatic illustration, in partial elevation, of another transmissive detector, in accordance with an embodiment.

FIG. 12 is a diagrammatic illustration of a multi-plane transmissive detector system, in accordance with an embodiment.

FIG. 13 is a plot of simulated spectral performance of the multi-plane transmissive detector of FIG. 12.

FIGS. 14A-14D show configurations for a transmissive detector, in accordance with embodiments.

FIG. 15 is a diagrammatic illustration of a multi-plane imaging system, in accordance with an embodiment.

FIG. 16 is a flowchart illustrating a method of processing multi-plane image information to recover phase information, in accordance with an embodiment.

FIG. 17 shows an exemplary configuration for using a transmissive detector to control an active optical element, in accordance with an embodiment.

FIG. 18 is a diagrammatic illustration of another multi-plane imaging system, in accordance with an embodiment.

FIG. 19 is a diagrammatic illustration of a multi-plane imaging system suitable for use in hyperspectral imaging, in accordance with an embodiment.

FIGS. 20A and 20B are a diagrammatic illustration and expanded inset, respectively, of a prior art plenoptic camera imaging system.

FIG. 21 is a diagrammatic illustration of a volumetric imaging system including transmissive detectors, in accordance with an embodiment.

FIG. 22 shows a simulated binary test object, in accordance with an embodiment.

FIG. 23 shows a simulated image of the test object of FIG. 22 as detected by one of the transmissive detectors of FIG. 21 at a Fourier plane of an imaging system, in accordance with an embodiment.

FIG. 24 shows a simulated image of the test object of FIG. 22 as detected at a first image plane that is not conjugate to the object plane of the test object, of the imaging system, in accordance with an embodiment.

FIG. 25 shows another simulated image of the test object of FIG. 22 detected at a second image plane that is not conjugate to the object plane of the test object, of the imaging system, in accordance with an embodiment.

FIG. 26 shows a simulated image of the test object of FIG. 22 detected at an image plane that is conjugate to the object plane of the test object, of the imaging system, in accordance with an embodiment.

FIG. 27 is a flowchart for a method of processing multi-plane image information to recover EM energy phase information, in accordance with an embodiment.

FIG. 28 shows a simulated image of recovered phase associated with the simulated image of FIG. 23, in accordance with an embodiment.

FIG. 29 shows a simulated image of recovered phase associated with the simulated image of FIG. 24, in accordance with an embodiment.

FIG. 30 shows a simulated, recovered image of the test object of FIG. 22, in accordance with an embodiment.

FIG. 31 is a flowchart for a method for characterizing EM energy that propagates along a light path, in accordance with an embodiment.

DETAILED DESCRIPTION OF THE DRAWINGS

This disclosure, including the following description, is presented to enable one of ordinary skill in the art to make and use the embodiments herein. Descriptive terminology adopted herein to enhance the reader's understanding such as, for example, upper and lower, is not intended as limiting. Upon reading and fully appreciating this disclosure, various modifications to the described embodiments will be readily apparent to those skilled in the art, and the principles herein may be applied to other embodiments. Thus, the present description is not intended to be limited to the embodiments shown, but is to be accorded the widest scope consistent with the principles and features described herein.

Although a number of examples in the present disclosure may show detection of the visible portion of the EM spectrum, the embodiments disclosed herein are not intended to be limited to this portion of the EM spectrum but may be adapted for detection of EM energy outside of visible wavelengths with the use of appropriate optical elements and detector materials. Additionally, while the PIN diode configuration is used in the exemplary embodiments, the photosensitive regions of transmissive detectors may alternatively be formed from Schottky junctions, avalanche photodiodes, bolometric sensors or other types of photosensitive structures as appropriate for a given application.

It is noted that the transparent detectors for monochromatic optical device monitoring and the phase detectors referenced above are typically configured for monitoring only the intensity of the EM energy, and there is a need for transmissive detectors with higher efficiencies as compared with traditional PIN diodes. In addition, with respect to a variety of applications, to be described at appropriate points hereinafter, there is a need for detectors that exhibit improved broadband performance characterized at least in part by reduced spectral dependencies.

The following disclosure describes the manufacture and use of transmissive detectors that partition EM energy into distinct portions and determine certain information from at least one of the distinct portions. An example of such partitioning is separation of incident EM energy into (i) one portion, which is detected (and thereby measured) to determine certain information of a particular information domain contained therein, and (ii) another portion transmitted therethrough without measurement. It is recognized herein that EM energy information, when measured, provides a value for a scalar or vector quantity that characterizes the EM energy so measured; therefore, EM energy information may be understood to include one or more distinct characteristics of the EM energy. Furthermore, EM energy may contain EM energy information in multiple information domains. In the context of the present disclosure, an information domain may be understood to be a set of possible scalar or vector values for a given characteristic of the EM energy. Possible information domains include, for example, phase, amplitude (which is directly related to intensity), direction, wavelength and polarization.

In accordance with the present disclosure, a transmissive detector may be configured for partitioning EM energy incident thereon into two or more portions, interrogating an information domain of one of the portions to obtain EM energy information therefrom, and generating an electronic signal in accordance with the EM energy information so obtained. For instance, a detector that partitions and interrogates EM energy information in the wavelength domain may be configured to be spectrally selective, so as to provide wavelength discrimination. A spectrally selective detector may selectively absorb and interrogate either a broad band (e.g., tens of nanometers or more) or a narrow band (e.g., ten nanometers or less) of wavelengths of the EM energy.

A transmissive detector, in accordance with the present disclosure, is different from prior art transparent detectors in that the transmissive detector may be used to selectively absorb a controlled portion of the EM energy to interrogate and obtain a measurement of one or more information domains of the EM energy by partitioning the incident EM energy and measuring a selected portion thereof. That is, in the context of the present disclosure, interrogation of EM energy information may be understood as analysis of selectively partitioned EM energy for extraction of EM energy information with respect to one or more characteristics of the received electromagnetic energy. In the context of the present disclosure, partitioning of EM energy information refers to the selective apportioning of EM energy information from any information domain into one of three types: 1) interrogated and essentially altered; 2) interrogated but transmitted without being essentially altered; and 3) not interrogated, but simply transmitted and without essential alteration. Different information domains may be interrogated individually, or multiple domains may be interrogated simultaneously.

FIG. 4 illustrates an example of the simultaneous interrogation of wavelength and amplitude information domains. FIG. 4 shows a plot 400 illustrating an example of EM energy information partitioning and measurement, in accordance with an embodiment. FIG. 4 represents an idealized example of spectrally partitioning amplitude of incident EM energy such that various portions of the wavelength and amplitude domains are at least partially interrogated. Plot 400 has wavelength in nanometers as the abscissa and percentage transmission on the ordinate. A heavy black line 405 represents a spectral transmission function of a transmissive detector that partitions and interrogates the EM energy in accordance with the present disclosure.

Continuing to refer to FIG. 4, a first region 410 is represented by a diagonal crosshatched area from 400 to 500 nm in wavelength and from 50 to 100% in transmission. First region 410 corresponds to EM energy information that is carried by at least a component of the EM energy, along its associated light path. The component can be interrogated such that it is selectively absorbed, detected and essentially altered to provide a measurement such as a current or voltage. In the context of the present disclosure, essential alteration of EM energy information may be understood to mean that the EM energy information is detected and converted to another form that is not EM energy. For example, in first region 410, 50% of the EM energy having wavelengths from 400 to 500 nm is absorbed by a transmissive detector and, therefore, is essentially altered as it produces electron-hole pairs in the transmissive detector.

Still referring to FIG. 4, a second region 420 is represented by a square crosshatched area from 400 to 500 nm in wavelength and from 0 to 50% in transmission. Second region 420 corresponds to EM energy information that is interrogated and transmitted without being essentially altered such that it may continue along a light path of the EM energy for subsequent use. That is, the EM energy information in second region 420 remains at least partially measurable in at least one domain (e.g., the EM energy information in second region 420 has a SNR greater than zero). A third region 430, which is represented by a diagonally hatched area from 500 to 700 nm in wavelength and from 0 to 100% in transmission, corresponds to EM energy information that is transmitted without interrogation or essential alteration thereof.

While partitioning of the EM energy information may, in conventional transparent detectors, result in reduced measurability, the transmissive detectors of the present disclosure can be configured to reduce such a reduction in measurability. For example, it is recognized that any variation in thickness and/or refractive index of materials forming the transmissive detector may generate variation in phase information of detected or transmitted EM energy. If thickness and/or refractive index variations are large and random such that an optical thickness (e.g., a product of thickness and refractive index) varies over a range from zero to one wavelength or more, then a phase of EM energy transmitted through the transmissive detector may not be determinable, because measurable effects of phase become insolubly convoluted with effects of the random index and/or refractive index variations. However, if the thickness and/or refractive index variations are still random but are small, such that the optical thickness varies only over a range from zero to a few percent of one wavelength, then the phase information of the EM energy transmitted therethrough may be evaluated. In this regard, a transmissive detector designed in accordance with the present disclosure may include tight tolerances of thicknesses and refractive indices to allow evaluation of the phase information of EM energy transmitted therethrough. As another example, when measuring polarization, minimization of depolarizing effects in the transmissive detector may be important, while when measuring intensity, minimization of scattering or attenuation effects may be more important.

A transmissive detector may be designed, in accordance with the present disclosure, to partition and interrogate different information domains in both temporal and spatial realms. Temporal realm interrogation may provide, for example, time-dependent measurements in an information domain. As another example, spatial realm interrogation may provide spatially-dependent measurements in an information domain. A plurality of transmissive elements, designed in accordance with the present disclosure, may be used individually or organized into one-dimensional (i.e., "1-D" or 1×N), two-dimensional (i.e., "2-D" or M×N) or three-dimensional (i.e., "3-D" or L×M×N) arrays for imaging or other applications. Such arrays may be configured to provide specific spatial realm interrogation. For example, a series of interrogations by a single transmissive detector (i.e., a combination of single point spatial sampling and multiple point temporal sampling) may provide information regarding power (i.e., time varying intensity) of the EM energy at a single spatial point. Alternatively, a single sample by each transmissive element in a 3-D array (i.e., a combination of single point temporal sampling and multiple point spatial sampling) may provide simultaneous information about intensity and phase of EM energy at multiple spatial points.

It is noted that the aforementioned prior art, such as the '014 patent, does not specifically discuss the aforedescribed information domains. Additionally, it appears that the prior art does not address the organization of a plurality of transmissive elements, in side-by-side relationships with one another, to provide 1-D, 2-D or 3-D detector arrays for imaging or other applications. While the '014 patent notes that a semi-transparent detector may be used for monitoring the power from each laser device of an array of laser devices, it does not teach that such detectors may be combined with other detectors to form detector arrays. That is, the prior art appears to adopt a view of "one detector per laser device".

The following discussion of FIGS. 5A, 5B, 6 and 7 describes transmissive detectors that interrogate intensity and wavelength information domains. FIG. 5A schematically illustrates a transmissive detector 500, including photosensitive layer 110, transparent conductive layers 120 and 130 and substrate 140, as previously described in association with thin film detector 100 of FIG. 1. EM energy is incident on and passes through transmissive detector 500 along light path 510. Transmissive detector 500 further includes an antireflective ("AR") coating 540 formed from a plurality of thin film layers, in accordance with an embodiment. AR coating 540 may improve partitioning and interrogation of the EM energy information by transmissive detector 500, by further tailoring the absorption and transmission performance of transmissive detector 500 relative to prior art photosensitive detectors, such as thin film detector 100 of FIG. 1.

An enlarged view of a portion A of detector 500 (indicated by a dashed oval in FIG. 5A), showing further details of AR coating 540, is illustrated in FIG. 5B. AR coating 540 may be formed, for example, of a series of thin film layers, such as layers 550, 560, 570, 580 and 590 as shown. For example, layers 560 and 580 may be formed of a high refractive index material, such as silicon oxynitride ("SiON"), while layers 550, 570 and 590 are formed from a low refractive index material, such as BLACK DIAMOND® ("BD"). Alternatively, pairs of materials with larger refractive index differences, such as silicon dioxide ("SiO$_2$") and tantalum pentoxide ("Ta$_2$O$_5$") may be used to form alternating layers within AR coating 540. When larger refractive index differences are present in the materials used to form AR coating 540, fewer layers, than are shown in FIG. 5B, may be required to achieve the desired anti-reflective effects. In an example, AR coating 540 may be designed for broadband transmission in the visible spectrum.

An exemplary design for thin film layers 550, 560, 570, 580 and 590 forming AR coating 540 is summarized in TABLE 1. For each thin film layer, as indicated by the reference number that refers to that layer in FIG. 5B, TABLE 1 includes exemplary values for the layer's material, refractive index, extinction coefficient and physical thickness that are suitable for forming AR coating 540.

TABLE 1

| Layer | Material | Refractive Index | Extinction Coefficient | Physical Thickness (nm) |
|---|---|---|---|---|
| 550 | BD | 1.40885 | 0.00023 | 260.77 |
| 560 | SiON | 2.06687 | 0.00145 | 110.67 |
| 570 | BD | 1.40885 | 0.00023 | 141.08 |
| 580 | SiON | 2.06687 | 0.00145 | 38.24 |
| 590 | BD | 1.40885 | 0.00023 | 10.33 |

It should be noted that the illustration of the five layers forming AR coating 540 is exemplary only; that is, AR coating 540 may alternatively have fewer or more layers than the five layers shown. The number of layers in a specific AR coating is related to desired transmission and absorption characteristics of a given transmissive detector as a whole.

FIG. 6 shows a plot 600 of calculated spectral performance of transmissive detector 500 of FIG. 5A. Plot 600 has wavelength in nanometers as the abscissa and percentage as the ordinate. Overall reflectance 610 of transmissive detector 500 is indicated by a dashed line. Absorptance 620 of photosensitive layer 110 only is represented by a dash-dot line. Transmittance 630 of transmissive detector 500 as a whole is represented by a dotted line. Absorptance 640 of all layers of transmissive detector 500 other than photosensitive layer 110 is represented by a solid line nearly coincident with the ordinate axis.

It may be seen in plot 600 that, particularly in a wavelength range of approximately 430 to 620 nm, an average value of reflectance 610 is less than 10% and an average value of absorptance 620 is greater than 50% in this wavelength range. Referring now to FIG. 6 in conjunction with FIG. 3, the spectral performance of transmissive detector 500, including AR coating 540, and that of prior art thin film detector 100 may be compared by comparing plot 600 with plot 300. It may be seen that transmissive detector 500 exhibits improved efficiency compared to that of prior art thin film detector 100, as indicated by the decreased average reflectance of less than 10% in plot 600 in comparison to approximately 50% in plot 300 for the wavelength range of approximately 430 to 620 nm. Similarly, average absorptance of transmissive detector 500 is approximately 50% of the EM energy over this wavelength range, while average absorptance of thin film detector 100 is approximately 30% averaged over this wavelength range, thereby indicating that transmissive detector 500 exhibits better partitioning of the EM energy for this wavelength range.

FIG. 7 is an illustration of a transmissive detector 700 formed from thinned crystalline material and including an AR coating formed from a plurality of thin film layers, in accordance with an embodiment. Transmissive detector 700 may be considered an alternative construction of a transmissive detector, as compared to detector 500 of FIG. 5A. Transmissive detector 700 includes the elements described in association with thinned detector 200 of FIG. 2, as well as a group of layers 760, 770, 780 and 790 forming an AR coating 750. Layers 770 and 790 may be formed, for example, from a high refractive index material such as Ta$_2$O$_5$. Layers 760 and 780 may be formed, for example, from a low refractive index material such as SiO2 such that AR coating 750 is an alternating stack of high and low refractive index thin film layers. Like AR coating 540 in transmissive detector 500, AR coating 750 may improve the partitioning and interrogation of EM energy incident on transmissive detector 700 by altering absorption and transmission performance of transmissive detector 700 relative to that of thinned detector 200. Again, AR coating 750 may include additional layers for further altering the absorption and transmission performance.

A transmissive detector may be used with or without additional detectors. For example, a transmissive detector used alone may detect approximately 50% of incident EM energy within a particular wavelength range, such as from 400 to 700 nm, while the remaining incident EM energy, following transmission through the transmissive detector, may be subsequently detected by one or more additional detector. In this way, one or more transmissive detectors may be integrated into a multi-plane imaging system. As another example, a transmissive detector may be integrated into goggles worn by a user, whereby the transmissive detector is used to record images of objects that are simultaneously viewed by the user; in this example, the human eye may be considered a second detector in the total imaging system. An additional detector suitable for use in conjunction with a transmissive detector may be any type of EM energy detecting device or structure such as, but not limited to, a charge coupled device ("CCD"), a charge injection device ("CID"), a complementary metal oxide semiconductor ("CMOS") detector, silver halide film and a human viewer.

For a multi-plane measurement system with N transmissive detectors, a desired absorptance, $f_i$, at the i-th transmissive detector may be defined as $$f_i = \frac{1}{N-i+1},$$

where $1 \leq i \leq N$ for equal partitioning of the incident EM energy among the N transmissive detectors. Equal partitioning of EM energy may advantageously provide high SNR for all N transmissive detectors. As an example, for a dual plane measurement system, including a transmissive detector and a second, completely absorptive detector, equal partitioning of the EM energy between the transmissive detector and the second detector may help maximize the SNR for both detectors.

A desirable characteristic for transmissive detectors in certain multi-plane measurement systems is reduced spectral dependence of the detector absorptance, transmittance and reflectance. For example, a transmissive detector with spectral dependence over a given range of wavelengths may be used in interrogation of EM energy over that range of wavelengths without requiring color filters and/or color correction processing.

In accordance with an embodiment, a transmissive detector may be configured to detect EM energy by absorbing a first portion of incident EM energy while transmitting a second portion of the EM energy therethrough. FIG. 8 illustrates, in partial elevation, two transmissive detectors 800(1) and 800 (2) (collectively, detectors 800), in accordance with an embodiment. While transmissive detectors 800 are shown in the following examples as formed of a plurality of thin films, it may be understood by those skilled in the art that thinned crystalline material may be used instead. Transmissive detectors 800 include photosensitive layer 110, transparent conductive layers 120 and 130 and substrate 140 as previously described in association with thin film detector 100 of FIG. 1. Transmissive detectors 800(1), 800(2) further includes first and second layer groups 810(1), 810(2) and 850(1), 850(2), respectively. Each of first and second layer groups 810 and 850, respectively, may include a plurality of layers of high refractive index and low refractive index materials; for example, either or both of first and second layer groups 810 and 850 may be formed of a thin film arrangement similar to AR coating 540 of FIGS. 5A and 5B.

Continuing to refer to FIG. 8, first and second layer groups 810 and 850 affect the transmission and absorption characteristics of transmissive detectors 800 by tailoring the interference, reflection and refraction effects within the thin film layers forming transmissive detectors 800.

Two specific transmissive detectors 800(1) and 800(2), including exemplary designs of first and second layer groups 810 and 850 respectively, are discussed immediately hereinafter. In a first example, layer groups 810(1) and 850(1) provide approximately 50% transmissive characteristics (i.e., approximately 50/50 transmission/absorption). An exemplary design for a 50% transmissive detector 800(1) is summarized in TABLE 2, which includes layer numbers, reference numbers corresponding to elements of 50% transmissive detector 800(1) of FIG. 8, and material, refractive index, extinction coefficient and optical thickness for each layer. The optical thickness values correspond to those calculated for a reference wavelength of 550 nm. As may be noted in TABLE 2, each of first and second layer groups 810(1) and 850(1) is formed of six alternating layers of high refractive index ($Ta_2O_5$) and low refractive index ($SiO_2$) thin films.

TABLE 2

| Layer | Reference Number | Material | Refractive Index | Extinction Coefficient | Optical Thickness |
|---|---|---|---|---|---|
| 1 | 850(1) | $SiO_2$ | 1.45992 | 0.00000 | 0.18589981 |
| 2 | | $Ta_2O_5$ | 2.14091 | 0.00000 | 0.23364571 |
| 3 | | $SiO_2$ | 1.45992 | 0.00000 | 0.02265060 |
| 4 | | $Ta_2O_5$ | 2.14091 | 0.00000 | 0.13077058 |

TABLE 2-continued

| Layer | Reference Number | Material | Refractive Index | Extinction Coefficient | Optical Thickness |
|---|---|---|---|---|---|
| 5 | | $SiO_2$ | 1.45992 | 0.00000 | 0.22953170 |
| 6 | | $Ta_2O_5$ | 2.14091 | 0.00000 | 0.15681051 |
| 7 | 120 | ITO | 2.05000 | 0.01400 | 0.03727273 |
| 8 | 110 | Si (FILM) | 4.40000 | 0.63000 | 0.39613687 |
| 9 | 130 | ITO | 2.05000 | 0.01400 | 0.03727273 |
| 10 | 810(1) | $Ta_2O_5$ | 2.14091 | 0.00000 | 0.16623076 |
| 11 | | $SiO_2$ | 1.45992 | 0.00000 | 0.23697596 |
| 12 | | $Ta_2O_5$ | 2.14091 | 0.00000 | 0.39992614 |
| 13 | | $SiO_2$ | 1.45992 | 0.00000 | 0.29399852 |
| 14 | | $Ta_2O_5$ | 2.14091 | 0.00000 | 0.37544109 |
| 15 | | $SiO_2$ | 1.45992 | 0.00000 | 0.30899972 |
| Substrate | 140 | Glass | 1.51852 | 0.00000 | |

The approximately 50/50 transmission/absorption characteristic of 50% transmissive detector 800(1) is one example of possible information partitioning that may be provided by a transmissive detector, in accordance with an embodiment. As previously discussed, such equal partitioning of EM energy information helps to increase the SNR for the overall imaging system.

Referring now to FIG. 9 in conjunction with FIG. 8, FIG. 9 shows a plot 900 of simulated spectral performance of 50% transmissive detector 800(1) tailored for approximately 50% transmissive characteristics in accordance with the characteristics summarized in TABLE 2. Plot 900 has wavelength in nanometers as the abscissa and percentage as the ordinate. A dashed line 910 represents overall reflectance of transmissive detector 800(1). A dash-dot line 920 represents absorptance of photosensitive layer 110 only. A dotted line 930 represents transmittance of this transmissive detector as a whole. A solid line 940 (nearly coincident with the abscissa) represents absorptance of all layers of 50% transmissive detector 800(1) other than photosensitive layer 110. As may be noted by comparison of plots 300, 600 and 900, 50% transmissive detector 800(1) is more efficient and more spectrally uniform than either of uncoated detector 100 of FIG. 1 and and AR coated detector 500 of FIG. 5A, since it exhibits an average 50% absorptance, an average 45% transmission and improved spectral uniformity for both the transmission and the absorptance. Over the wavelength range from 400 to 700 nm, the transmittance and absorptance as shown in plot 900 vary by approximately 20% (e.g., from 40% to 60%), whereas in the detectors of FIGS. 1 and 5, variations over the same wavelength range are 40% or more. The spectral uniformity of the transmission and absorption make 50% transmissive detector 800(1) suitable for grayscale detection.

Another exemplary layer design for first and second layer groups 810 and 850 of a transmissive detector 800(2) tailored for EM energy selection in the blue wavelengths, is summarized in TABLE 3. Similar to TABLE 2, TABLE 3 includes layer numbers, reference numbers corresponding to elements of transmissive detector 800(2) of FIG. 8, but with material, refractive index, extinction coefficient and optical thickness for each layer, where the optical thickness values again correspond to those calculated for a reference wavelength of 550 nm. In the design summarized in TABLE 3, first layer group 810(2) is formed of nine alternating layers of high refractive index (e.g., $Ta_2O_5$) and low refractive index (e.g., $SiO_2$) thin films, while second layer group 850 is formed of eight alternating layers of $Ta_2O_5$ and $SiO_2$. As may be seen upon comparison of TABLES 2 and 3, the blue-selective transmissive detector design summarized in TABLE 3 utilizes more layers and different thicknesses than the design of 50% transmissive detector 800(1), summarized in TABLE 2.

TABLE 3

| Layer | Reference Number | Material | Refractive Index | Extinction Coefficient | Optical Thickness |
|---|---|---|---|---|---|
| 1 | 850(2) | SiO$_2$ | 1.45992 | 0.00000 | 0.20456857 |
| 2 | | Ta$_2$O$_5$ | 2.14091 | 0.00000 | 0.37795559 |
| 3 | | SiO$_2$ | 1.45992 | 0.00000 | 0.43764307 |
| 4 | | Ta$_2$O$_5$ | 2.14091 | 0.00000 | 0.29273832 |
| 5 | | SiO$_2$ | 1.45992 | 0.00000 | 0.04594267 |
| 6 | | Ta$_2$O$_5$ | 2.14091 | 0.00000 | 0.10915540 |
| 7 | | SiO$_2$ | 1.45992 | 0.00000 | 0.23023657 |
| 8 | | Ta$_2$O$_5$ | 2.14091 | 0.00000 | 0.21956042 |
| 9 | 120 | ITO | 2.05000 | 0.01400 | 0.03727273 |
| 10 | 110 | Si (FILM) | 4.40000 | 0.63000 | 0.05923315 |
| 11 | 130 | ITO | 2.05000 | 0.01400 | 0.03727273 |
| 12 | 810(2) | Ta$_2$O$_5$ | 2.14091 | 0.00000 | 0.28694147 |
| 13 | | SiO$_2$ | 1.45992 | 0.00000 | 0.20796915 |
| 14 | | Ta$_2$O$_5$ | 2.14091 | 0.00000 | 0.58331550 |
| 15 | | SiO$_2$ | 1.45992 | 0.00000 | 1.12809951 |
| 16 | | Ta$_2$O$_5$ | 2.14091 | 0.00000 | 0.46971662 |
| 17 | | SiO$_2$ | 1.45992 | 0.00000 | 0.41850643 |
| 18 | | Ta$_2$O$_5$ | 2.14091 | 0.00000 | 0.53427386 |
| 19 | | SiO$_2$ | 1.45992 | 0.00000 | 0.03616996 |
| 20 | | Ta$_2$O$_5$ | 2.14091 | 0.00000 | 0.50436366 |
| Substrate | | Glass | 1.51852 | 0.00000 | |

FIG. 10 shows a plot 1000 of simulated spectral performance of transmissive detector 800(2) tailored to perform as a blue-selective detector in accordance with the design summarized in TABLE 3. Transmissive detector 800(2), numerically modeled for the generation of plot 1000, is designed to provide approximately 50/50 detection and transmission in the blue portion of the visible wavelength spectrum (e.g., 400 nm-500 nm), while transmitting EM energy from 500 to 700 nm. Plot 1000 has wavelength in nanometers as the abscissa and percentage as the ordinate. A dashed line 1010 represents reflectance of this blue-selective transmissive detector. A dash-dot line 1020 represents absorptance of photosensitive layer 110 only. A dotted line 1030 represents transmittance of this transmissive detector as a whole. A solid line 1040, which is nearly coincident with the abscissa, represents absorptance of all layers of transmissive detector 800(2) other than photosensitive layer 110. As shown by lines 1020 and 1030, transmissive detector 800(2) formed in accordance with the design of TABLE 3 is spectrally selective for blue wavelengths since its photosensitive layer absorbs approximately 40% of EM energy in the 400 to 500 nm wavelength range while transmitting approximately 50% in the same wavelength range. In fact, it may be seen that plot 1000 of FIG. 10 is a realization of the information partitioning plot shown in FIG. 4, wherein EM energy of the wavelength range of 400 to 500 nm is interrogated by transmissive detector 800(2), while EM energy of wavelengths from 500 to 700 nm are not interrogated (i.e., are transmitted through transmissive detector 800(2)).

In the aforedescribed design examples of TABLES 2 and 3, the exemplary materials in each of layer groups 810 and 850 are SiO$_2$ and Ta$_2$O$_5$. These materials may be deposited using, for example, ion beam sputtering or other known methods such as those compatible with semiconductor processing. Although these aforedescribed examples show exemplary modifications of layer thicknesses and total number of layers and related specific effects upon transmission and absorption characteristics of certain embodiments of the transmissive detector, it is understood that other materials, layer thicknesses and numbers of layers forming layer groups 810 and 850 may be utilized to provide other transmission and absorption characteristics of other transmissive detectors similar to transmissive detector 800. Furthermore, other materials such as metamaterials and/or polarization selective materials or structures (e.g., materials exhibiting form birefringence) may be used to achieve different specification goals, such as polarization- or spectrally-selective broadband detection over a prescribed spectrum.

A transmissive detector designed in accordance with embodiments herein may receive EM energy either from what one skilled in the art would recognize as a top side (e.g., second layer group 850, FIG. 8) or from a back side (e.g., through substrate 140, FIG. 8). Photosensitive layer 110 may be formed of any material sensitive to the wavelengths of interest and may be selected, for instance, on the basis of having an electronic bandgap comparable to an energy characterizing a wavelength of EM energy to be detected. Exemplary materials suitable for use in the aforedescribed embodiments of the transmissive detector include, but are not limited to, silicon, germanium, gallium arsenide, indium gallium arsenide, lead sulfide, lead arsenide, gallium nitride and mercury cadmium telluride. Bandgap engineering may also be performed by inclusion of for example, strained-layer quantum wells of the abovementioned materials into the transmissive detector design.

Various components of transmissive detector embodiments, such as thin film layers and a substrate, may be modified to optimize interrogation characteristics of a particular information domain while reducing unnecessary information loss. For example, thin films or metamaterials may be used to form a quasi-resonant structure that selectively enhances coupling (e.g., induced absorption) of selected wavelengths into a photosensitive layer while selectively transmitting other wavelengths. Alternatively, thin films or metamaterials may be used to selectively suppress coupling (i.e., induced transmission) of certain wavelengths with the photosensitive layer.

In one embodiment, a transmissive detector may be fabricated on a transparent surface. Alternatively, the transmissive detector may be fabricated on a substrate that has spectral filtering characteristics (e.g., an ability to transmit or absorb different wavelengths). For example, a transmissive detector substrate may be configured to perform spectral filtering by transmitting infrared ("IR") and not transmitting visible ("VIS") EM energy; the resulting transmissive detector may be useful in a dual function IR/VIS imaging system.

Furthermore, a transmissive detector may be configured to be polarization sensitive so as to select which polarizations of incident EM energy (e.g., linear, circular or elliptical polarization) are transmitted or absorbed by the transmissive detector. For instance, substrate 140 of FIG. 8 may be formed of a linear or circular polarizer. Additionally, one of the thin film layers and/or the substrate may be formed of a birefringent material such that different polarization states are differently affected by the transmissive detector. In this way, a transmissive detector may be configured to interrogate a polarization information domain.

Turning now to FIG. 11, an example of a transmissive detector with polarization sensitivity is illustrated. FIG. 11 illustrates, in partial elevation, a transmissive detector 1100 formed from a plurality of thin films and including polarization-selecting elements, in accordance with an embodiment. Transmissive detector 1100 includes photosensitive layer 110, transparent conductive layers 120 and 130 and substrate 140, as previously described in association with thin film detector 100 (FIG. 1), and further includes a wire-grid polarizer 1115 separated from transparent conductive layer 120 by a thin film layer group 1150. Thin film layer group 1150 may provide desired spectral or transmission performance characteristics, such as by incorporating one or more sets of layer groups 810 and 850, as described above in connection with transmissive detector 800.

In FIG. 11, wire-grid polarizer 1115 is shown as formed from alternating first and second regions 1155 and 1160, respectively. First regions 1155 may be formed of metal such as aluminum or copper, while second regions 1160 may be formed of dielectric material such as silicon dioxide or silicon nitride. As an example, wire-grid polarizer 1115 may be formed by depositing a layer of metal via sputtering or physical deposition, lithographically patterning the deposited metal, thereby forming first regions 1155 while etching away certain sections, then filling those etched sections by depositing a dielectric material to form second regions 1160. As shown, wire grid polarizer 1115 forms a linear polarizer that may reflect and/or absorb one linear polarization state of incident EM energy while transmitting EM energy of an orthogonal polarization state.

As a variation to the aforedescribed embodiments, two or more transmissive and/or conventional detectors may be combined to form multi-plane detector systems. In the context of the present disclosure, a multi-plane detector system is understood to be an arrangement configured for detecting EM energy at more than one detection plane therein. A detection plane may be, but is not limited to, a geometric plane. Multi-plane detector systems may include, for instance, composite detectors that are formed on a common substrate, or a plurality of distinct detectors. Multi-plane detector systems may further include assemblies for imaging to form multi-plane imaging systems; for example, a transmissive detector may be located at a surface that is associated with a conjugate object plane.

By interrogating EM energy information at two or more surfaces, multi-plane detector systems may be configured to enable interrogation of additional information domains of EM energy, such as propagation direction and phase. For example, each detector of such a multi-plane detector system may provide location information for EM energy; consequently, propagation direction information may be defined as a vector connecting at least two locations so measured. As another example, when EM energy detectors are capable of measuring the intensity of incident EM energy at only one detection plane, phase information may be recovered from analysis of measured intensities at multiple detection planes. Furthermore, if a polarization selective transmissive detector, such as transmissive detector 1100 of FIG. 11, is included in a multi-plane detector system, its polarization-dependent performance may be used advantageously. For example, a multi-plane detector system may include a polarization selective transmissive detector that detects 50% of incident EM energy at a single polarization state over a range of wavelengths, while another detector detects the remainder of the EM energy, regardless of polarization, that was transmitted through the polarization selective transmissive detector.

FIG. 12 is an illustration of a multi-plane transmissive detector system 1200 formed from thin films, in accordance with an embodiment. Multi-plane transmissive detector system 1200 includes first and second transmissive detectors 1210 and 1220, respectively, both supported on and separated by substrate 140. The photosensitive layers included in first and second transmissive detectors 1210 and 1220 may be configured for detection of the same or different wavelength ranges.

Continuing to refer to FIG. 12, multi-plane transmissive detector system 1200 may be configured to form a measurement system for characterizing a polarization ratio of incident EM energy. In this example, first transmissive detector 1210 may be configured similarly to transmissive detector 800 of FIG. 8, while second transmissive detector 1220 is configured as a polarization selective transmissive detector, such as that shown in FIG. 11. EM energy enters multi-plane transmissive detector system 1200 from first transmissive detector 1210, which does not interrogate the polarization domain but detects and absorbs 50% of the incident EM energy. First transmissive detector 1210 then transmits 50% of the incident EM energy through to second transmissive detector 1220, which is configured to be sensitive to a particular polarization state. Analysis of measurements at first and second transmissive detectors 1210 and 1220 may be used to determine a polarization ratio of the incident EM energy.

Various modifications to multi-plane transmissive detector system 1200 will be apparent to those skilled in the art upon reading and appreciating the disclosure herein. For example, first and second transmissive detectors may be formed on the same side of a substrate. Optionally, a substrate may be formed of a polarizing material while first and second transmissive detectors are both configured to not be polarization selective. Additionally, variations in material or thickness of a substrate may be tailored to define a specific phase relationship between first and second transmissive detectors on opposite sides of the substrate. Furthermore, a second transmissive detector (located, for example, where transmissive detector 1220 is shown in FIG. 12) may be replaced with an opaque, non-transmissive detector.

Referring now to FIG. 13 in conjunction with FIG. 12, FIG. 13 shows a plot 1300 of simulated spectral performance of multi-plane transmissive detector system 1200. The simulation that generated plot 1300 assumes that the incident EM energy is unpolarized or at least contains equal amounts of two orthogonal polarization states, such as S and P linear polarization states. Plot 1300 has wavelength in nanometers as the abscissa and transmission percentage as the ordinate. A solid line 1310 represents transmission of first transmissive detector 1210 for both S and P polarized EM energy. A dash-dot line 1320 represents P polarized EM energy transmitted by first transmissive detector 1210 and subsequently received at second transmissive detector 1220. A dashed line 1330, which is almost coincidental with the abscissa, represents the S polarized EM energy transmitted by first transmissive detector 1210 and subsequently received at second transmissive detector 1220. It may be seen in plot 1300 that dashed line 1330 is nearly zero over the range of wavelengths shown in plot 1300, indicating that second transmissive detector 1220 is configured to be P polarization selective.

A transmissive detector may be formed by pixelating a single transmissive detector into a plurality of transmissive photosensitive elements, or a plurality of transmissive photosensitive elements may be individually formed and assembled in side-by-side relationships with one another to form an array. Such transmissive photosensitive elements may be configured as, for example regular or irregular polygons such as triangles or hexagons. In an embodiment, a transmissive detector may be designed to provide uniform spatial sampling by configuring the transmissive photosensitive elements to be identical in size and uniformly distributed across the transmissive detector. FIGS. 14A-14D show examples of ways in which a 2-D array of transmissive elements may be configured, in accordance with embodiments, to define a sensing zone for imaging EM energy. First referring to FIG. 14A, a transmissive detector 1400 includes a plurality of transmissive elements 1410 that are arranged as an array of squares for providing uniform spatial sampling. In FIG. 14B, a transmissive detector 1425 is formed from a plurality of irregularly shaped transmissive photosensitive elements 1430 and annular transmissive photosensitive elements 1435. Each of annular transmissive photosensitive elements 1435 may be further subdivided into arc shaped sections 1445. It may be seen that, since the size, shape and distribution of the various transmissive photosensitive elements of transmissive detector 1425 are non-uniform, transmissive detector 1425 thereby provides non-uniform spatial sampling. As may be seen in FIG. 14C, a transmissive detector 1450 includes a plurality of rectangular transmissive photosensitive elements 1460. As a further alternative, a transmissive detector 1475 is formed from a Penrose tiling of a plurality of diamond-shaped, transmissive photosensitive elements 1480. In general, a transmissive detector may include from any regular or irregular transmissive photosensitive elements that tessellate a surface. The exemplary configurations of transmissive detectors 1400, 1425, 1450 and 1475 may be used to subdivide any of aforedescribed transmissive detectors 500, 700, 800, 1100 and 1200 (FIGS. 5A, 7, 8, 11 and 12, respectively).

A spatial frequency response of each of the transmissive detectors shown in FIGS. 14A-14D is related to the size and shape of the transmissive photosensitive elements of that transmissive detector. For example, the square arrangement of transmissive photosensitive elements 1410 of transmissive detector 1400 provides periodic and discretized spatial frequency response in the horizontal and vertical directions, while the rectangular shape of transmissive photosensitive elements 1460 of transmissive detector 1450 contribute to reduced spatial frequency response in the vertical direction while providing greater spatial frequency response in the horizontal direction. The Penrose tiling of transmissive photosensitive elements 1480 of transmissive detector 1475 provides another type of discretized spatial frequency response that may be useful for avoiding aliasing. Since each transmissive detector shown in FIGS. 14A-14D has a unique spatial frequency response, each may be tailored to provide spatial frequency discrimination.

Any of the aforedescribed transmissive detectors, such as those shown in FIGS. 5A, 7, 8, 11 and 12 may be further formed from a plurality of transmissive photosensitive elements, as shown in FIGS. 14A-14D. For instance, a plurality of transmissive photosensitive elements of a transmissive detector may be configured to provide specific polarization selectivity, such as on an element-by-element basis in a particular plane of measurement. A transmissive detector including such an arrangement of transmissive photosensitive elements may be used to measure, for example, a polarization ratio of incident EM energy in a spatial realm, such as across an aperture. Alternatively, if such a transmissive detector, including an arrangement of a plurality of transmissive photosensitive elements, is placed in a Fourier plane of an imaging system, then the transmissive detector may be configured to measure a polarization ratio in a spatial frequency realm.

Each transmissive photosensitive element may be designed to have transmissive and/or absorptive characteristics that are the same or different from other transmissive photosensitive elements in the same transmissive detector, for any information domain. If the sensitivity and shape characteristics of the transmissive photosensitive elements in a transmissive detector are varied, the transmissive detector may provide detection, transmission, and/or polarization selective detection that is spatially non-uniform. Characteristics of a plurality of transmissive photosensitive elements in a transmissive detector may be uniform (e.g., when every element is the same), vary in a specific pattern (such as for a Bayer pattern or a Penrose pattern) or be fully random (e.g., where each element is different from all another elements). A transmissive detector may include a plurality of transmissive photosensitive elements that detect or transmit, on an element-by-element basis, distinct spectral (e.g., wavelength) bands or combinations of such bands. Additionally, each transmissive photosensitive element may have different transmission or polarization selective characteristics.

A transmissive detector formed from a plurality of transmissive photosensitive elements may interrogate incident EM energy and information of the EM energy as a function of both spatial frequency and wavelength. For example, the transmissive photosensitive elements of a transmissive detector may have uniform geometries that are organized in a spatially uniform manner (e.g., all of the transmissive photosensitive elements are of the same shape and are spatially related to one another by simple translations) so as to provide uniform spatial sampling of one or more information domains, where spatial sampling may be defined by a discrete number of spatial frequencies. As another example, the transmissive photosensitive elements of a transmissive detector array may have non-uniform geometries that are organized in a spatially non-uniform manner so as to provide non-uniform spatial sampling of one or more information domains. For applications such as hyperspectral imaging, the plurality of transmissive photosensitive elements may be configured with non-uniform spectral dependence of absorptance so as to customize partitioning of wavelength information of EM energy.

In another embodiment, a transmissive detector may be configured to provide interrogation of different information domains of EM energy in the temporal and spatial realms, for example, to form images, to perform ranging of objects and/or to reconstruct a four-dimensional ("4-D") field of the incident EM energy. A 4-D field may be defined using four variables x, y, A and $\phi$ corresponding to amplitude (A) and phase ($\phi$) of EM energy at a given point (x, y) in a plane. As discussed immediately hereinafter, a reconstructed 4-D field may be used, for example, for computational image processing such as refocus, aberration correction, adaptive optics and simulation of phase modification, such as wavefront coding.

FIG. 15 is an illustration of a multi-plane imaging system 1500 for imaging an object 1510 (shown as a set of paperclips in FIG. 15), in accordance with an embodiment. Multi-plane imaging system 1500, as shown in FIG. 15, includes optics 1520, a first detector 1530 and a second detector 1540. EM energy 1505 from object 1510 is directed by optics 1520 through first detector 1530 and subsequently transmitted to second detector 1540. Optics 1520 may include, but is not limited to, lenses, refractive elements, diffractive elements, active optical components, apodizing elements, conformal surfaces, and/or wavefront coding elements. While first detector 1530 is shown as a transmissive detector, second detector 1540 does not need to be transmissive. First detector 1530 may, for example, be positioned at an imaging plane that is conjugate to a hyperfocal object plane so as to image objects at large object distances. Second detector 1540 may, for example, be positioned at another imaging plane that is suitable for imaging objects located much closer than the hyperfocal distance. A transmissive detector in imaging system 1500 may also be formed adjacent to or as an integral part of optics 1520. For example, optics 1520 is shown to include a third detector 1550, which is transmissive, disposed at a Fourier plane of imaging system 1500. A Fourier plane may exist at or near to a principal plane of optics 1520. Additionally, a fourth detector 1552, which is transmissive, may be formed conformally upon a surface of optics 1520 such that the associated detector array forms a curved contour as indicated in FIG. 15. It is further noted, as indicated in FIG. 15 that detector 1552 is arranged on a support surface of a support structure 1554, and that support structure 1554 and another support structure 1553 support detector 1550.

FIG. 15 shows the various detectors in multi-plane imaging system 1500 as being serially arranged such that EM energy 1505 from object 1510 is detected and/or transmitted through each detector sequentially. Alternatively, the detectors may be arranged in other serial and/or parallel arrangements, such as with the inclusion of additional optics (e.g., a beam splitter). Parallel arrangements may, for example, utilize transmissive detectors in a split field arrangement, such as in a stereoscopic imaging system.

Continuing to refer to FIG. 15, object 1510 is shown within an object volume 1560, which may be further divided into object planes such as a nearer field plane 1570 and a farther field plane 1580. First, second, third and fourth detectors 1530, 1540, 1550 and 1552, respectively, may provide first, second, third and fourth outputs (e.g., electronic signals as electrical image data) 1535, 1545, 1555 and 1557, respectively. Outputs 1535, 1545, 1555 and 1557 may be processed by processor 1590 to provide information about object 1510 at any or all object planes, such as nearer and farther field planes 1570 and 1580, in object volume 1560.

Optionally, a wavefront coding element 1585 may be disposed at any plane of imaging system 1500 between object 1510 and detector 1540. For example, as shown in FIG. 15, wavefront coding element 1585 may be positioned at or near a pupil or principal plane of optics 1520. In addition, wavefront coding element 1585 may be an active optical element that is able to respond to an input signal, such as a mechanical force or applied electrical field; processor 1590 may be further configured to generate a control signal 1587 as such an input signal for controlling wavefront coding element 1585.

FIG. 16 is a flowchart illustrating a method 1600 of processing multi-plane image information to recover phase information, in accordance with an embodiment. A multi-plane imaging system including transmissive detectors, as described herein, provides EM energy detection at several different planes, each of which may be associated, for example, with a conjugate object plane in an object volume. Method 1600 begins with an optional preparation step 1610, during which any system preparation may be performed. System preparation may include, but not limited to, positioning of objects to be imaged and detection system components, and setting of detection system parameters, such as aperture and exposure times. For example, preparation step 1610 may include positioning multi-plane imaging system 1500 of FIG. 15 with respect to object 1510 such that object 1510 is located three meters from optics 1520.

Continuing to refer to FIG. 16, image information is captured at two or more detectors in a step 1620. Each of the two or more detectors may be disposed with respect to the object and within the multi-plane imaging system so as to capture specific information. For example, as described earlier in reference to FIG. 15, first detector 1530 is disposed at an imaging plane that is conjugate to a hyperfocal object plane while second detector 1540 is disposed at another imaging plane that is suitable for imaging objects located closer than the hyperfocal distance; in this way, the first and second detectors cooperate to capture information at different object planes in a single exposure.

Still referring to FIG. 16, the information captured in step 1620 is processed in a step 1630 to recover EM phase information regarding the object being imaged. The phase information is absent from the captured information because intensity, captured at any particular detector, is proportional to an absolute square of complex amplitude of detected EM energy; since phase information is contained in the complex coefficient of the detected EM energy, it is generally not recoverable from the intensity information captured at a single detector. Given the intensity information captured at the two or more detectors, one of several methods may be used for recovering phase information. A variety of phase retrieval methods are also discussed by Feinup (see Feinup, "Phase retrieval algorithms: a comparison," *Applied Optics*, Vol. 21, No. 15 (August 1982)); one example of an appropriate phase retrieval method is the Gerchberg-Saxton recursive algorithm (see Gerchberg, et al., "A practical algorithm for the determination of the phase from image and diffraction plane pictures," *Optik*, Vol. 35 (1972), pp. 237-46). Once phase information is recovered in step 1630, four-dimensional (4-D) EM field information (e.g., EM energy as a function of position (x, y), amplitude A and phase $\phi$) may be defined and processed in a step 1640 for the planes at which the two or more detectors are located.

The 4-D EM energy field information may be used for one of a variety of tasks such as, but not limited to, computational volumetric imaging, computational refocus, computational autofocus, ranging, computational aberration correction, computational adaptive optics, simulation of wavefront coding, and other computational processing. Computational volumetric imaging involves processing the 4-D EM energy field information for modeling propagation of the 4-D field throughout an image volume, considered as a plurality of image planes, conjugate to an object volume (e.g., object volume 1560 of FIG. 15). Then, method 1600 ends in a step 1650. Computational refocus and computational autofocus involve modeling the propagation of a reconstructed 4-D EM field by methods such as Fresnel, Fourier slice and fractional Fourier-transform techniques to a plane or planes conjugate to an object plane of interest (see, for example, Ng, "Fourier slice photography," Proceedings of SIGGRAPH, ACM Transactions on Graphics, July 2005; Ozaktas et al., "Fractional Fourier transforms and their optical implementation: II," J. Opt. Soc. Amer. A, Vol. 10 (1993), pp. 2522-2531; and Namias, "The fractional order Fourier transform and its application in quantum mechanics," J. Inst. Math. Appl., Vol. 25 (1980), pp. 241-265). Computational focus uses the 4-D EM energy field, as determined at one or more detection planes of the multi-plane imaging system, to calculate an EM energy intensity distribution at an arbitrary or predetermined conjugate plane by numerical means.

Still referring to FIG. 16, computational autofocus is similar to computational refocus except that the conjugate plane is not arbitrary or predetermined but is selected based upon a merit function or metric. For example, if method 1600 is to be utilized to implement computational autofocus, step 1640 may additionally include steps for mathematically modeling the propagation of the 4-D EM energy field to a plane and, subsequently, calculating a merit function. The merit function may be based, for example, upon magnitude or contrast of high spatial frequency components of the propagated 4-D EM energy field, since the ability to determine high spatial frequencies in images may be indicative of good focus. If a given image is determined, in accordance with the merit function, to not be in focus, then the 4-D field may be modeled by mathematical propagation to a different plane and the merit function recalculated. These steps within step 1640 may be repeated until a particular image is determined to be in focus (e.g., by meeting a user-defined parameter).

Other uses of the 4-D field include ranging, computational aberration correction, computational adaptive optics and simulation of wavefront coding, which all may involve mathematically processing the 4-D field information in ways that do not necessarily involve modeling of the 4-D field propagation. For instance, ranging may involve the determination of spatial properties of objects in an image, which may include, but are not limited to, distances to objects from a point of detection, sizes and orientations of objects and/or relative locations (i.e., distances therebetween) of objects. In method 1600, ranging may be performed by adding, to step 1640, steps for processing and analyzing 4-D field information by methods such as those described by Johnson et al. (see, "Passive ranging through wavefront coding: information and application," Applied Optics, Vol. 39, No. 11, pp. 1700-1710) then further taking phase into account in the analysis.

FIGS. 17-19 illustrate further examples of multi-plane imaging systems, including one or more transmissive detectors that are respectively configured for controlling active optical elements extended depth of field imaging and hyperspectral imaging. FIG. 17 shows an exemplary configuration for using a transmissive detector to control an active optical element, such as an adaptive optical element or an optoelectronic component. A control system 1700 includes first and second transmissive detectors 1710 and 1720, respectively, that are located on opposite sides of an active optical element 1730. As shown in FIG. 17, first and second transmissive detectors 1710 and 1720 provide first and second outputs 1740 and 1750, respectively, to a controller 1760. First and second outputs 1740 and 1750 may be, for example, in the form of electronic signals. Controller 1760 processes first and second outputs 1740 and 1750 and provides an input 1770 to active optical element 1730, which is configured to receive input 1770 and modify its optical parameters accordingly. Active optical element 1730 may be, for example, a spatial light modulator ("SLM"), an opto-acoustic modulator, a phase modulator, a polarization modulator, a liquid lens or a combination of multiple elements, such as a multiple lens zoom system. Control system 1700 may alter the phase and/or amplitude of EM energy transmitted through control system 1700. For example, in the case where active element 1730 is a transmissive SLM, first and second transmissive detectors 1710 and 1720 may be configured to cooperate with controller 1760 so as to alter the shape (e.g., planar, convex or concave) of a wavefront transmitted through control system 1700 by varying input 1770 accordingly.

FIG. 18 is an illustration of another multi-plane imaging system, in accordance with an embodiment. An imaging system 1800 includes first and second detectors 1830 and 1840, respectively. While first detector 1830 is a transmissive detector, second detector 1840 does not necessarily need to be transmissive. EM energy 1805 (indicated as rays encircled by a dashed oval) from object 1510 is directed by optics 1820 onto first and second detectors 1830 and 1840. Optics 1820 may be formed from a single optical element, as shown in FIG. 18, and/or may include a plurality of optical elements cooperating to direct EM energy 1805 to first and second detectors 1830 and 1840. First detector 1830 may be positioned, for example, at a first imaging plane that is conjugate to a hyperfocal object plane so as to be suitable for imaging objects at large object distances (i.e., at hyperfocal distance). Second detector 1840 may be positioned, for example, at a second imaging plane that is suitable for imaging objects located much closer than the hyperfocal distance.

Optionally, imaging system 1800, as shown in FIG. 18, further includes a phase modifying element 1850, which may be formed onto a surface of optics 1820. Phase modifying element 1850 may be configured as a wavefront coding element as disclosed in, for example, U.S. Pat. No. 5,748,371 to Cathey et al., incorporated herein by reference in its entirety. Phase modifying element 1850 extends depth of field (e.g., a range of object distances over which an object, when imaged through an imaging system, results in an in-focus image) of imaging system 1800 beyond that of a diffraction-limited imaging system without the phase modifying element. Alternatively, two or more phase modifying elements, or phase modifying effects thereof, may be distributed over multiple surfaces of components within imaging system 1800 or located at different places within system 1800. Furthermore, first and second detectors 1830 and 1840 may be configured to provide first and second outputs 1835 and 1845, respectively, that may be processed by a processor 1860. Processor 1860 may further produce a control signal (not shown) that may be used to control another active element, such as was shown in FIG. 17.

Imaging system 1800 may be customized for use in a particular application, such as within a mobile phone camera system. For example, in such a camera system, first detector 1830 may be positioned at an imaging plane that is conjugate to a hyperfocal object plane for imaging objects at large object distances (e.g., a hyperfocal distance greater than 50 cm). Second detector 1840 may then be disposed at an imaging plane that is suitable for detecting objects located closer than the hyperfocal distance (e.g., from 5 to 50 cm). Information provided by first and second detectors 1830 and 1840 at the aforementioned imaging planes, combined with the use of phase modifying element 1850, may provide for extended depth of field imaging for objects located at object distances ranging from 5 cm to infinity. Moreover, processor 1860 may process the image information obtained at first and second detectors 1830 and 1840 to create a single focused image. The processing performed by processor 1860 may involve one or more of a variety of known methods (see, for example, Burt et al., "Enhanced image capture through fusion", *International Conference on Computer Vision* (1993), pp. 173-182; Ogden et al., "Pyramid-based computer graphics," *RCA Engineer*, Vol. 30 No. 5 (1985), pp. 4-15; Haeberli, *Grafica Obscura* web site, www.sgi.com/grafica; Agarwala et al., "Interactive digital photomontage," *ACM SIGGraph* 2004 *Conference Proceedings* (2004); and AUTO-MONTAGE by Synoptics Co., www.synoptics.co.uk); all of these references are incorporated herein by reference in their entireties.

Turning now to FIG. 19, a multi-plane imaging system suitable for use in hyperspectral imaging, in accordance with an embodiment, is illustrated. Within the context of the present disclosure, hyperspectral imaging is understood to be an imaging technique whereby different wavelength bands are independently imaged so as to enable spectroscopic imaging. An imaging system 1900 includes first, second and third detectors 1930, 1940 and 1950, respectively. As shown in FIG. 19, EM energy 1805 from object 1510 is directed by optics 1920 toward first, second and third detectors 1930, 1940 and 1950. First and second detectors 1930 and 1940 are transmissive detectors for transmitting at least a portion of incident EM energy 1805 therethrough. In the exemplary imaging system illustrated in FIG. 19, third detector 1950 need not be transmissive. First, second and third detectors 1930, 1940 and 1950 may be configured to provide first, second and third outputs 1935, 1945 and 1955, respectively. First, second and third outputs 1935, 1945 and 1955 may be processed by a processor 1960 to extract information about object 1510.

Continuing to refer to FIG. 19, optics 1920 may be formed from a broadband transmissive material, such as CLEARTRAN® from Rohm & Haas; in this case, imaging system 1900 may be used for wavelengths from less than 400 nm to 10 µm. If optics 1920 exhibits wavelength-dependence in its effective focal length, then first and second detectors 1930 and 1940 and third detector 1950 may be positioned such that optics 1920 brings EM energy of different wavelength ranges of interest to focus upon different ones of first, second and third detectors 1930, 1940 and 1950. For example, first detector 1930 may be configured for detecting UV EM energy while allowing other wavelengths to be transmitted therethrough. Similarly, second detector 1940 may be configured for detecting VIS EM energy while transmitting other wavelengths, while third detector 1950 is configured for detecting near-infrared wavelengths. In this way, each of the first, second and third detectors detects a subset of EM energy over a large range of wavelengths.

In a further embodiment, a fourth detector (not shown) may be added to detect another wavelength range, such as in the mid-infrared. That is, additional transmissive detectors may be included in a multi-plane imaging system, such as that illustrated in FIG. 19, in order to obtain the desired broadband detection performance.

Turning now to FIGS. 20A and 20B, an example of a prior art plenoptic camera imaging system for providing volumetric image data is illustrated. A plenoptic camera 2000 of FIGS. 20A and 20B is similar to that described by Ng et al. in "Light Field Photography with a Hand-held Plenoptic Camera," Stanford Tech Report CTSR 2005-02, incorporated herein by reference in its entirety. Considering complementarity of the EM field (e.g., by Babinet's Principle), an EM energy intensity distribution from an object may be represented by EM energy from an aperture 2010 positioned within a screen 2020, which defines an object plane. Since the intensity distribution of the object may be represented as a sum of plane waves of EM energy of differing spatial frequencies, plane waves 2030 may be considered representative of the total EM energy emanating from an object.

As shown in FIG. 20A, aperture 2010 is illuminated by plane waves 2030 of EM energy with wavelength λ. In reference to the object, a single spatial frequency of EM energy of wavelength λ forms n sinusoidal intensity oscillations across the object. In an aperture model, the sinusoidal intensity oscillations arise from a wavefront that exhibits 2nλ radians of phase variation across aperture 2010 along a dimension D as shown in FIG. 20A or, equivalently, an nλ misalignment of a phase front with respect to the extent of aperture 2010. That is, a direction vector 2040 of plane waves 2030 is inclined with respect to an optical axis 2035 of plenoptic camera 2000, forming an angle Θ that may be expressed as $$\sin(\Theta) = \frac{n\lambda}{D}$$

or, in a paraxial approximation, $$\Theta \approx \frac{n\lambda}{D}$$

with respect to optical axis 2035. EM energy of different spatial frequencies intercept a principal or Fourier plane 2050 (represented by a Cartesian grid in FIG. 20A) of optics 2055 at different locations. Direction vector 2040 intersects Fourier plane 2050 at a first location 2060 and at a height $$H_1 = \frac{nf\lambda}{D}$$

from optical axis 2035. Less inclined plane waves may intersect Fourier plane 2050 at second and third locations 2062 and 2065 with heights $$H_2 = \frac{2f\lambda}{D} \text{ and } H_3 = \frac{f\lambda}{D},$$

respectively. Plane waves 2030 are then directed by optics 2055 to a lenslet array 2070, which is located at an image plane and includes a plurality of lenslets 2075 for further directing the plane waves to a detector array 2080, located at an image plane of lenslet array 2070. Detector array 2080 includes a plurality of detector elements 2085, each detector element 2085 including a further sub-array 2087 of photosensitive elements, as shown in an expanded inset in FIG. 20B. Plenoptic camera 2000 is complicated by the requirement that, in order to capture volumetric image information, lenslet array 2070 and detector array 2080 must be positioned with high accuracy with respect to optics 2055 and each other. Also, it is noted that, in plenoptic camera 2000, spatial-frequency phase information is decoded using $N^2$ oversampling, as provided by detector array 2080. Furthermore, it may be deduced that the number of detector elements required to achieve N×N image resolution in plenoptic camera 2000 is $(N \times N)^2 = N^4$.

FIG. 21 is an illustration of a volumetric imaging system including transmissive detectors for capturing volumetric image information, in accordance with an embodiment. Plane waves 2030 propagates though volumetric imaging system 2100 in a similar manner as through plenoptic camera 2000 but with important differences. First, volumetric imaging system 2100 includes a transmissive detector 2150, which is placed at the Fourier image plane of optics 2155. Transmissive detector 2150 may be integrated into optics 2155, as in optics 1520 that included transmissive detector 1550 therein as shown in FIG. 15. Transmissive detector 2150 may be used to directly and simultaneously measure the Fourier image of the incident EM energy at a variety of locations such as, for example, first location 2160, second location 2162 and third location 2165. Second, lenslet array 2070 and detector array 2080, of the prior art plenoptic camera, are replaced with a single transmissive detector array 2180 that has a plurality of elements 2185. Volumetric imaging system 2100 may be further configured to form a secondary image 2188 at a second image plane 2190 and a tertiary image 2192 at a third image plane 2195.

Continuing to refer to FIG. 21, in conjunction with FIGS. 20A and 20B, volumetric imaging system 2100, unlike plenoptic camera 2000, does not require both a lenslet array and a detector array, including sub-sampling thereof. That is, since volumetric imaging system 2100 integrates two transmissive detectors 2150 and 2180 therein, volumetric imaging system 2100 is capable of obtaining multi-plane imaging performance so as to achieve resolution comparable to that of prior art plenoptic camera 2000 while reducing the positioning tolerance requirements. For example, as noted earlier, the number of detector elements required to achieve N×N image resolution in plenoptic camera 2000 is $(N \times N)^2 = N^4$. In contrast, volumetric imaging system 2100 requires only N×N transmissive photosensitive elements in detector 2150 and N×N detector elements in detector 2180 (i.e., $2 \times N^2$ elements total) to achieve N×N image resolution, offering an advantage in cost, size and required processing power over plenoptic camera 2000.

Moreover, volumetric imaging system 2100 differs fundamentally from plenoptic camera 2000 in the manner in which spatial frequency phases are measured. As noted earlier, spatial-frequency phase information is extracted from plenoptic camera 2000 using $N^2$ oversampling, as provided by detector array 2080. In volumetric imaging system 2100, however, 2N oversampling is used to derive spatial-frequency phase information using techniques such as the Gerchberg-Saxton algorithm, which will be described in further detail below.

An example of a volumetric imaging method, in accordance an embodiment, is discussed in association with FIGS. 22-30 in conjunction with FIG. 21. FIGS. 22-26 are examples of idealized, single plane sample images that may be detected by transmissive detectors and processed, for instance, by method 1600 of FIG. 16 in association with volumetric imaging system 2100 of FIG. 21. While single plane images are shown throughout the following discussion for clarity, this simplification should not be considered limiting in any way, since any object volume may be divided into a series of single plane slices. The following discussion of FIGS. 22-30 assumes volumetric imaging system 2100 has a focal length of 5 mm and an aperture of 2 mm (f/2.5). An object plane (e.g., a location of screen 2020) is assumed to be located one meter from optics 2155. A Fourier image plane is defined as the location of optics 2155 and transmissive detector 2150. A first image plane (e.g., a location of transmissive detector array 2180) is assumed to be located at the focus of the lens, corresponding to 25 μm in front of a plane conjugate to the object plane. A second image plane (e.g., second image plane 2192) is assumed to be located 5 μm in front of a plane conjugate to the object plane.

FIG. 22 shows a simulated, binary test object 2200, simulated as being at the object plane of volumetric imaging system 2100, FIG. 21. FIG. 23 shows a first simulated image 2300 of binary test object 2200 of FIG. 22, as detected by transmissive detector 2150 at a Fourier plane of volumetric imaging system 2100. It is noted that first simulated image 2300 of FIG. 23 has been contrast enhanced and converted, with some fine details removed, into a contour representation for clarity. FIGS. 24 and 25 show second and third simulated images 2400 and 2500, respectively, of binary test object 2200 as detected at a plane that is not conjugate to the object plane. Second and third simulated images 2400 and 2500 may be examples of secondary and tertiary images 2188 and 2192 detectable at planes 2190 and 2195, respectively, of FIG. 21. Again, for clarity, second and third simulated images 2400 and 2500 have been contrast enhanced and converted, with some fine details removed, into a contour representation. FIG. 26 shows a fourth simulated image 2600 of binary test object 2200 of FIG. 22 detected at an image plane conjugate to the object plane. Fourth simulated image 2600 is an example of image data that may be detected by transmissive detector 2150 of FIG. 21 and represents an ideal in-focus image of binary test object 2200.

FIG. 27 is a flowchart for an exemplary method of processing multi-plane image information to recover EM energy phase information, in accordance with an embodiment. In particular, the flowchart shown in FIG. 27 further illustrates details of step 1630 to recover phase information in FIG. 16. The method illustrated in FIG. 27 includes an implementation of the Gerchberg-Saxton method (see, for example, Gerchberg, et al., "A practical algorithm for the determination of the phase from image and diffraction plane pictures," Optik, Vol. 35(1972), pp. 237-46, incorporated herein by reference in its entirety), although other appropriate methods may be used as well.

Referring to FIG. 27 in conjunction with FIG. 15, intensity image data captured at multiple planes may be processed by the method shown in FIG. 27. As illustrated in FIG. 27, a first intensity image $I_1$, detected at a first image plane $P_1$, and a second intensity image $I_2$, detected at a second image plane $P_2$, are input into a step 2710 that generates first and second amplitude images $A_1$ and $A_2$. First and second intensity images $I_1$ and $I_2$ may correspond with electrical image data as output 1555 from transmissive detector 1550 and one of outputs 1535 and 1545 from first and second detectors 1530 and 1540, respectively. In an example, first and second initial amplitude images $A_1$ and $A_2$ may be generated by calculating the square root of each of first and second intensity images $I_1$ and $I_2$.

Then, in a step 2720, a trial phase may be provided (for example as an assumption or as an educated guess) and assigned to first and second initial amplitude images A1 and A2 to define first and second initial EM field distributions $E_1$ and $E_2$. The trial phase may be, for instance, a zero flat phase for the entire image or may be based on a priori knowledge of the specific imaging system.

In a step 2730, the propagation of first EM field distribution $E_1$ from imaging plane $P_1$ to imaging plane $P_2$ is computationally modeled so as to generate a first modified EM field distribution $E_1'$ including a first phase $\phi_1$. Propagation may be modeled by one of a variety of methods such as, but not limited to, Fresnel, Fourier slice and fractional Fourier transform methods.

In a step 2740, first phase $\phi_1$ is used as an initial guess for the phase of second EM field distribution $E_2$. In a step 2750, the propagation of second EM field distribution $E_2$ from imaging plane $P_2$ to imaging plane $P_1$ is computationally modeled to calculate a second modified EM field distribution including a second phase $\phi_2$. It may be appreciated that propagation of the EM energy, at least through free space and/or linear optical media, can be computationally modeled according to either forward or reverse directions, and that the latter computation may be employed for computationally modeling the second phase based on reverse propagation. In a step 2760, second phase $\phi_2$ is compared with the initial guess for the phase of $E_1$. Then, a decision 2770 is made to determine whether a convergence of solutions has been achieved. If the difference between $\phi_2$ and the initial guess for the phase of $E_1$ is less than a user defined parameter, then the answer to decision 2770 is "YES—convergence has been achieved" and method 2700 is ended with a step 2780. Otherwise, the answer to decision 2770 is "NO—convergence has not been achieved" and method 2700 returns to step 2730. Steps 2730, 2740, 2750 and 2760 may be repeated a predetermined number of times, and/or until convergence of solutions is achieved.

FIGS. 28 and 29 show image representations 2800 and 2900, respectively, of phase information associated with simulated images 2300 of FIGS. 23 and 2400 of FIG. 24, respectively, as calculated using method 2700 of FIG. 27. Once the phase information has been recovered in this way, the propagated EM field may be computed at any plane of interest within the imaging system. For example, as was discussed in association with step 1640 of FIG. 16, the propagation of a 4-D EM field to any plane conjugate to an associated object volume may be computationally modeled. For example, FIG. 30 shows a simulated image 3000 of binary test object 2200 of FIG. 22, calculated by computationally modeling propagation of the EM field by 25 microns from an image plane (e.g., the plane that produces in-focus image 2600 of FIG. 26) to another plane (e.g., the Fourier plane). It may be seen, by comparing simulated image 3000 with in-focus, fourth simulated image 2600, that at least an outline of an in-focus image of the original, binary test object has been recovered using the process shown in FIG. 27.

FIG. 31 is a flowchart for a method 3100 for characterizing EM energy that propagates along a light path. As discussed in connection with FIG. 4, the EM energy has at least a component that carries EM energy information along the light path. Step 3110 configures a (first) detector array to include photosensitive elements that are at least partially transparent with respect to the EM energy. An example of step 3110 is configuring an array of detectors 500 (see FIGS. 5A, 5B) and/or 800 (see FIG. 8) by designing and manufacturing the detector array with the layers specified in TABLE 1 (for detector 500) or TABLES 2 and 3 (for detector 800). Optionally, step 3110 establishes an intensity ratio between the EM energy absorbed by the first detector array and the EM energy that passes through the first detector array. An example of this optional step is detector 800(1) establishing a 50%/50% ratio between the EM energy absorbed by detector 800(1) and the EM energy passing therethrough. Also optionally, step 3110 provides a support surface for the detector array, such that at least a subset of the EM energy that passes through the detector array also passes through the support surface; the EM energy may pass through the support surface either before or after it passes through the detector array. An example of this optional step is manufacturing the array of detectors 500 and/or 800 on transmissive substrate 140, as shown in FIGS. 5 and 8.

Step 3120 arranges the detector array at a (first) position along the light path such that at least a subset of the photosensitive elements are in the path of the EM energy, so that at least part of the EM energy (including a first portion of the component) is absorbed and produces a first set of electrical image data to at least partially characterize the component. A second portion of the component passes through the photosensitive elements along the light path. An example of step 3120 is placing the array of detectors 500 in light path 510, as shown (for a single detector 500) in FIG. 5A.

An optional step 3130 provides a second detector array at a second position along the light path, and aligns the second detector array to receive at least some of the second portion of the component. The second detector array produces a second set of electrical image data based at least part on the second portion of the component. An example of step 3130 is providing second detector array 1840, as shown in FIG. 18. A further optional step 3140 configures a processor for determining a characteristic of the EM energy based on the first and second sets of electrical image data. An example of step 3140 is configuring processor 1860, as shown in FIG. 18. The EM energy information may correspond at least in part to a phase characteristic, and determining the characteristic may include determining the phase. Optionally, step 3140 includes producing first and second intensity images corresponding to the first and second positions, such that the first and second intensity images correspond to first and second transverse intensity distributions of the EM energy associated with the first and second positions, and using the first and second intensity images as part of determining the phase. When such first and second transverse intensity distributions are produced, step 3130 includes positioning the second detector array along the light path such that the second transverse intensity distribution is different from the first transverse intensity distribution.

In step 3140, determining the phase may include (a) providing a trial phase as an initial theoretical representation of said phase, (b) determining a first theoretical phase for said electromagnetic energy, associated with said second position along said path of propagation, based on said first intensity image and said trial phase; (c) determining a second theoretical phase for said electromagnetic energy, associated with said first position along said path of propagation, based on said second intensity image and said trial phase, (d) establishing a difference between said second theoretical phase and said trial phase at the first position, and (e) using the difference as an indication of a degree of accuracy of the trial phase. Examples of steps (a) through (e) are discussed in connection with FIGS. 22 through 30 above. Step (e) may include relying on the difference (determined in step (d)) as input for either accepting or rejecting the trial phase as the phase characteristic of the EM energy. Method 3100 ends at step 3150.

Although each of the aforedescribed embodiments have been illustrated with various components having particular respective orientations, it should be understood that the embodiments as described in the present description may take on a variety of specific configurations with the various components being located in a variety of positions and mutual orientations and still remain within the spirit and scope of the present description. Furthermore, suitable equivalents may be used in place of or in addition to the various components, the function and use of such substitute or additional components being held to be familiar to those skilled in the art and therefore falling within the scope of embodiments herein. For example, the imaging systems disclosed herein may include a greater or fewer number of transmissive detectors than shown in the aforedescribed figures. Additionally, a multi-plane imaging system may be further configured to provide, with suitable information processing, simultaneous hyperspectral and volumetric imaging from separate regions of the same detector. Therefore, the present examples are to be considered as illustrative and not restrictive, and the description is not to be limited to the details given herein but may be modified within the scope of the appended claims.

What is claimed is:
1. An imaging system for characterizing electromagnetic energy from an object that propagates along a light path, at least a component of said electromagnetic energy carrying electromagnetic energy information along said light path, said imaging system comprising:
    a first detector array arranged at a first position along said light path, said first detector array including a plurality of photosensitive elements aligned to receive at least some of said electromagnetic energy, including the component, said first detector array being configured to selectively absorb a first portion of said component, and to produce therefrom a first set of electrical image data based at least in part on said electromagnetic energy information to at least partially characterize the component of the electromagnetic energy, at least some of said photosensitive elements being at least partially transparent with respect to said electromagnetic energy, to selectively pass a second portion of said component therethrough to continue along said light path; and
    optics for directing electromagnetic energy from said object along said light path to the first detector array;
    wherein said plurality of photosensitive elements includes:
        a first layer group of alternating layers of high refractive index material and low refractive index material,
        a second layer group of alternating layers of high refractive index material and low refractive index material, first and second transparent conductive layers disposed between the first and second layer groups, and a photosensitive layer disposed between the first and second transparent conductive layers, at least the photosensitive layer having a non-zero extinction coefficient.

2. The imaging system of claim 1 including a first support arrangement defining a first support surface that supports the elements of the first detector array, said first support arrangement being at least partially transparent with respect to said electromagnetic energy, such that said plurality of photosensitive elements and said support arrangement allow the second portion of said component to pass through said first detector assembly to continue along said light path.

3. The imaging system of claim 1, said plurality of photosensitive elements being arranged in side-by-side relationships with one another to generally transversely intersect the light path.

4. The imaging system of claim 3, the plurality of detectors defining a sensing zone that is generally transverse to said light path.

5. The imaging system of claim 4, said sensing zone being generally planar.

6. The imaging system of claim 1, including a second detector array arranged at a second position along said light path such that said second detector array receives at least some of said second portion, and produces therefrom a second set of electrical image data based at least in part on said electromagnetic energy to further characterize said component.

7. The imaging system of claim 6, including a processor configured to determine a characteristic of said electromagnetic energy based on the first and second sets of electrical image data.

8. A detector assembly for characterizing electromagnetic energy that propagates along a light path, at least a component of the electromagnetic energy carrying electromagnetic energy information along said light path, said detector assembly comprising:

a first detector array arranged at a first position along said light path, said first detector array including a plurality of photosensitive elements aligned to receive at least some of said electromagnetic energy, including the component, said first detector array being configured to selectively absorb a first portion of said component, and to produce therefrom a first set of electrical image data based at least in part on said electromagnetic energy information to at least partially characterize the component of the electromagnetic energy, at least some of said photosensitive elements being at least partially transparent with respect to said electromagnetic energy, to selectively pass a second portion of said component therethrough to continue along said light path;

wherein:

said plurality of photosensitive elements are arranged in side-side relationships with one another to generally transversely intersect the light path, and the plurality of detectors define a sensing zone that is generally transverse to said light path, said sensing zone exhibiting a curved contour.

9. A method for characterizing electromagnetic energy from an object that propagates along a light path, said electromagnetic energy having a component that carries electromagnetic energy information along said light path, said method comprising:

configuring a first detector array to include a plurality of photosensitive elements that are at least partially transparent with respect to the electromagnetic energy;

directing the electromagnetic energy from said object along said light path to the first detector array using optics; and arranging the first detector array at a first position along said light path such that at least a subset of said plurality of photosensitive elements are in the light path, such that they (i) selectively absorb at least some of said electromagnetic energy, including a first portion of the component, and produce therefrom a first set of electrical image data to at least partially characterize the component, and (ii) selectively pass a second portion of the component through the photosensitive elements such that the second portion continues along said light path for a subsequent use;

wherein the step of configuring the first detector array includes configuring the plurality of photosensitive elements to include:

a first layer group of alternating layers of high refractive index material and low refractive index material, a second layer group of alternating layers of high refractive index material and low refractive index material, first and second transparent conductive layers disposed between the first and second layer groups, and a photosensitive layer disposed between the first and second transparent conductive layers, at least the photosensitive layer having a non-zero extinction coefficient.

10. The method of claim 9 wherein configuring the first detector array includes further providing an overall transparency of the first detector array, thereby establishing an intensity ratio between the first and second portions.

11. The method of claim 9 wherein configuring the first detector array further includes (i) providing a first support surface of a first support arrangement that is at least partially transparent with respect to said electromagnetic energy, and (ii) supporting the plurality of elements on said first support surface such that at least a subset of said second portion passes through said first support arrangement before continuing along said light path.

12. The method of claim 11 wherein arranging the first detector array includes orienting the first detector array so that the subset of the second portion passes through said first support arrangement before passing through said photosensitive elements.

13. The method of claim 9, further including providing a second detector array at a second position along the light path and aligning the second detector array for receiving at least some of said second portion of said component, as at least part of said subsequent use, and producing with said second detector array a second set of electrical image data based at least in part on said second portion of the component for further characterizing the component of the electromagnetic energy.

14. The method of claim 13, further including configuring a processor for determining a characteristic of said electromagnetic energy based on said first and second sets of electrical image data, said characteristic being at least generally associated with said electromagnetic energy information.

15. A method for characterizing electromagnetic energy that propagates along a light path, said electromagnetic energy having a component that carries electromagnetic energy information along said light path, said method comprising:

configuring a first detector array to include a plurality of photosensitive elements that are at least partially transparent with respect to the electromagnetic energy; and arranging the first detector array at a first position along said light path such that at least a subset of said plurality of photosensitive elements are in the light path, such that they (i) selectively absorb at least some of said electromagnetic energy, including a first portion of the component, and produce therefrom a first set of electrical image data to at least partially characterize the component, and (ii) selectively pass a second portion of the component through the photosensitive elements such that the second portion continues along said light path for a subsequent use;

wherein:
configuring the first detector array includes (i) providing a first support surface of a first support arrangement that is at least partially transparent with respect to said electromagnetic energy, and (ii) supporting the plurality of elements on said first support surface such that at least a subset of said second portion passes through said first support arrangement before continuing along said light path; and arranging the first detector array includes orienting the first detector array so that the subset of the second portion passes through said first support arrangement after passing through the photosensitive elements.

16. A method for characterizing electromagnetic energy that propagates along a light path, said electromagnetic energy having a component that carries electromagnetic energy information along said light path, said method comprising:

configuring a first detector array to include a plurality of photosensitive elements that are at least partially transparent with respect to the electromagnetic energy;

arranging the first detector array at a first position along said light path such that at least a subset of said plurality of photosensitive elements are in the light path, such that they (i) selectively absorb at least some of said electromagnetic energy, including a first portion of the component, and produce therefrom a first set of electrical image data to at least partially characterize the component, and (ii) selectively pass a second portion of the component through the photosensitive elements such that the second portion continues along said light path for a subsequent use;

providing a second detector array at a second position along the light path and aligning the second detector array for receiving at least some of said second portion of said component, as at least part of said subsequent use, and producing with said second detector array a second set of electrical image data based at least in part on said second portion of the component for further characterizing the component of the electromagnetic energy; and configuring a processor for determining a characteristic of said electromagnetic energy based on said first and second sets of electrical image data, said characteristic being at least generally associated with said electromagnetic energy information;

wherein said electromagnetic energy info illation corresponds at least in part to a phase characteristic of said electromagnetic energy, and determining a characteristic of said electromagnetic energy includes determining the phase.

17. The method of claim 16 wherein determining the phase includes producing a first intensity image and a second intensity image corresponding to said first and second positions, respectively, such that said first and second intensity images correspond to a first transverse intensity distribution and a second transverse intensity distribution of said electromagnetic energy associated with said first and second positions; and using the first and second intensity images as part of determining the phase.

18. The method of claim 17 wherein providing the second detector array includes positioning the second detector array along the light path from said first detector array such that said second transverse intensity distribution is different from said first transverse intensity distribution.

19. The method of claim 17 wherein determining the phase includes (a) providing a trial phase as an initial theoretical representation of said phase, (b) determining a first theoretical phase for said electromagnetic energy, associated with said second position along said path of propagation, based on said first intensity image and said trial phase;

(c) determining a second theoretical phase for said electromagnetic energy, associated with said first position along said path of propagation, based on said second intensity image and said trial phase, (d) establishing a difference between said second theoretical phase and said trial phase at the first position, and (e) using the difference as an indication of a degree of accuracy of the trial phase.

20. The method of claim 19 including relying upon the difference as at least one input for one of either accepting or rejecting the trial phase as the phase characteristic of the electromagnetic energy.

21. A method for characterizing electromagnetic energy from an object that propagates along a light path, said electromagnetic energy having a component that carries electromagnetic energy information along said light path, said method comprising:

providing a detector array including:
a first layer group of alternating layers of high refractive index material and low refractive index material,
a second layer group of alternating layers of high refractive index material and low refractive index material,
first and second transparent conductive layers disposed between the first and second layer groups, and
a photosensitive layer disposed between the first and second transparent conductive layers,
at least the photosensitive layer having a non-zero extinction coefficient;

directing said electromagnetic energy from said object along said light path to the detector array;

absorbing, at the detector array, at least some of said electromagnetic energy, including a first controlled portion of the component, at a first position on said light path, and producing therefrom a first set of electrical image data; and transmissively passing a second controlled portion of the component, such that the second controlled portion continues along said light path for a subsequent use.

* * * * *

UNITED STATES PATENT AND TRADEMARK OFFICE
CERTIFICATE OF CORRECTION

| | | |
|---|---|---|
| PATENT NO. | : 8,415,607 B2 | Page 1 of 1 |
| APPLICATION NO. | : 12/678241 | |
| DATED | : April 9, 2013 | |
| INVENTOR(S) | : Duerkson | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 477 days.

Signed and Sealed this
Seventh Day of October, 2014

Michelle K. Lee
*Deputy Director of the United States Patent and Trademark Office*